(12) United States Patent
Khosravan et al.

(10) Patent No.: US 12,361,454 B1
(45) Date of Patent: *Jul. 15, 2025

(54) HOME VALUATION USING IDENTIFIED EXTERIOR AND INTERIOR FEATURES SYSTEMS AND METHODS

(71) Applicant: MFTB Holdco, Inc., Seattle, WA (US)

(72) Inventors: Naji Khosravan, Seattle, WA (US);
Sing Bing Kang, Seattle, WA (US);
Ivaylo Boyadzhiev, Seattle, WA (US);
Pierre Moulon, Seattle, WA (US);
Yujie Li, Seattle, WA (US)

(73) Assignee: MFTB Holdco, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/483,398

(22) Filed: Oct. 9, 2023

Related U.S. Application Data

(63) Continuation of application No. 16/951,900, filed on Nov. 18, 2020, now Pat. No. 11,783,385.

(Continued)

(51) Int. Cl.
| | |
|---|---|
| *G06T 7/00* | (2017.01) |
| *G01S 17/89* | (2020.01) |
| *G06F 16/54* | (2019.01) |
| *G06F 16/587* | (2019.01) |
| *G06F 30/13* | (2020.01) |
| *G06N 20/00* | (2019.01) |
| *G06Q 30/02* | (2023.01) |
| *G06Q 30/0283* | (2023.01) |

(Continued)

(52) U.S. Cl.
CPC .......... *G06Q 30/0278* (2013.01); *G01S 17/89* (2013.01); *G06F 16/54* (2019.01); *G06F 16/587* (2019.01); *G06F 30/13* (2020.01); *G06N 20/00* (2019.01); *G06Q 30/0283* (2013.01); *G06Q 50/16* (2013.01); *G06T 7/0002* (2013.01); *G06T 7/174* (2017.01); *G06T 7/73* (2017.01); *G06T 11/00* (2013.01); *G06T 2210/04* (2013.01); *G06V 10/60* (2022.01); *G06V 20/176* (2022.01); *G06V 20/182* (2022.01); *G06V 20/188* (2022.01)

(58) Field of Classification Search
CPC .......... G06Q 30/0278; G06Q 30/0283; G06Q 50/16; G01S 17/89; G06F 16/54; G06F 16/587; G06F 30/13; G06T 7/0002; G06T 7/174; G06T 7/73; G06T 11/00
USPC ......................................................... 382/103
See application file for complete search history.

(56) References Cited

U.S. PATENT DOCUMENTS 11,783,385 B1 * 10/2023 Khosravan ............. G06Q 50/16
382/103

* cited by examiner

*Primary Examiner* — Ayodeji O Ayotunde
(74) *Attorney, Agent, or Firm* — Merchant & Gould P.C.

(57) ABSTRACT

A valuation system to identify interior features of a property, identify exterior features related to interior features using aerial images, and to generate property valuations based on the identified features is provided. The valuation system identifies, using a computer vision module, interior features based on interior image data (e.g., photos) of a property, and further identifies exterior features associated with any of the interior features based on an aerial photo of the property. For example, trees and buildings (e.g., exterior features) adjacent to a window (e.g., an interior feature) can be identified by a computer vision module through the combination of interior and exterior image data. In other words, the identification of property features by the computer vision module can be enriched by correlating interior image data (e.g., photos, video walkthroughs) to exterior image data (e.g., satellite photos, aerial photos).

20 Claims, 17 Drawing Sheets

Related U.S. Application Data

(60) Provisional application No. 62/938,765, filed on Nov. 21, 2019.

(51) Int. Cl.
*G06Q 50/16* (2012.01)
*G06T 7/174* (2017.01)
*G06T 7/73* (2017.01)
*G06T 11/00* (2006.01)
G06V 10/60 (2022.01)
G06V 20/10 (2022.01)

HOME VALUATION USING IDENTIFIED EXTERIOR AND INTERIOR FEATURES SYSTEMS AND METHODS

CROSS-REFERENCE TO RELATED APPLICATION(S)

This application is a continuation of U.S. patent application Ser. No. 16/951,900, filed on Nov. 18, 2020, now U.S. Pat. No. 11,783,385; which claims the benefit of U.S. Provisional Application No. 62/938,765, filed on Nov. 21, 2019, the contents of which are incorporated herein by reference in their entireties.

BACKGROUND

Online shopping is widely embraced by consumers, who enjoy reviewing pricing and product details online. However, the economics of real estate introduces obstacles to consumers casually shopping for a home. The advertised price can vary substantially from the eventual sale price. There is a need for increasing the accuracy of online price estimates of homes and real estate.

Further, aesthetic features of a home can substantially impact its value. However, these features can be especially difficult to evaluate online. For example, window views can be difficult to evaluate online. Shade/sun patterns, influenced by the positioning of windows and trees, can also be important to home buyers. Noise, from natural features or nearby commercial operations, can also substantially impact the value of a property. There is a need for automatically identifying and evaluating these interior/exterior features, and accounting for these features in price estimates (e.g., valuations).

SUMMARY

A valuation system to identify interior features of a property, identify exterior features related to interior features using aerial images, and to generate property valuations based on the identified features is provided. In some implementations, the valuation system identifies, using a machine learning module, interior features based on interior image data (e.g., photos, videos, renderings, etc.) of a property, and further identifies exterior features associated with any of the interior features based on aerial images of the property. For example, trees and buildings (e.g., exterior features) adjacent to a window (e.g., an interior feature) can be identified by a machine learning module through the combination of interior and exterior image data. In other words, the identification of property features by the machine learning module can be enriched by correlating interior image data (e.g., photos, video walkthroughs, etc.) to exterior image data (e.g., satellite photos, aerial photos, etc.).

Figure 1:
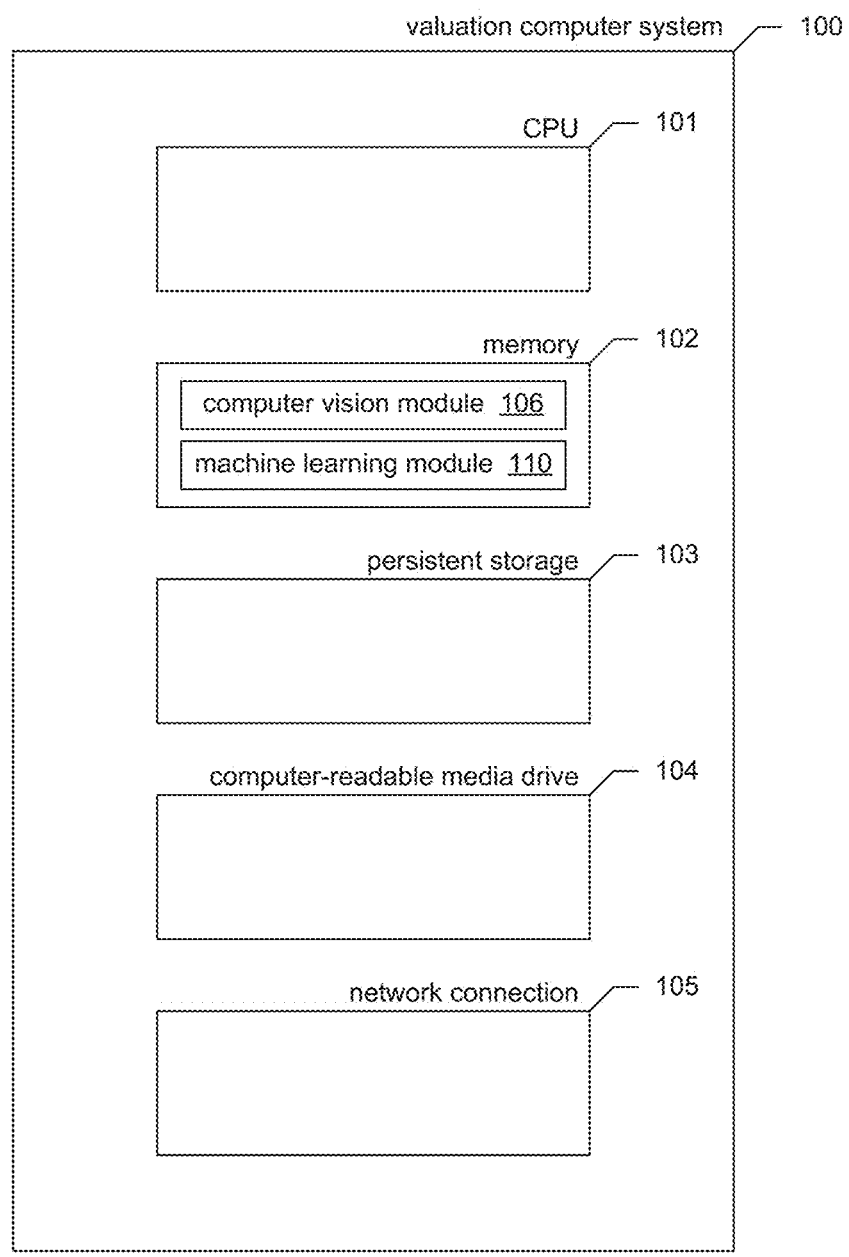
FIG. 1 is a block diagram showing some of the components typically incorporated in at least some of the computer systems and other devices on which the valuation system operates.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Methods and systems for employing a machine learning system to identify interior features of a property, identify exterior features related to interior features using outdoor images (e.g., aerial images), and to generate property valuations based on the identified features are provided. In some implementations, a valuation system identifies, using a machine learning module, interior features based on interior image data (e.g., photos) of a property, and further identifies exterior features associated with any of the interior features based on an outdoor photo of the property. For example, trees and buildings (e.g., exterior features) adjacent to a window (e.g., an interior feature) can be identified by the machine learning module through the combination of interior and exterior image data. In other words, the identification of property features by the machine learning module can be enriched by correlating interior image data (e.g., photos, video walkthroughs) to exterior image data (e.g., satellite photos, outdoor photos, aerial photos).

The valuation system can be configured to identify interior features, including attributes of the interior features. The valuation system can be configured to identify interior features from interior photos, interior videos (e.g., walk-through videos), panoramic photos, sound recordings, internet of things (IoT) data, and the like. The valuation system can identify cabinetry, windows, doors, fixtures, appliances, and so on. The valuation system can further be configured to identify attributes of the identified features, such as material/type, condition, size, shape, style, placement, orientation, and so on. For example, the valuation system can identify a marble countertop, a composite countertop, a double sink, a single sink, a wood-burning fireplace, and a gas-burning fireplace. The valuation system can also be configured to identify rooms based on interior image data, and/or determine a computer-generated floor plan based on interior images. The identified room can have interior features with interior attributes associated with the room type. For example, a kitchen room is associated with one or more interior features such as counters, cabinets, backslash appliances, or fixtures. As another example, a bathroom is associated with interior features such as tubs, showers, or counters. As another example, a living room is associated with floors, while a bedroom is associated with a room condition. Each of the interior features can be associated with one or more interior attributes. For example, a counter feature of the kitchen room can be associated with an interior attribute of old laminate, a cabinet feature of the kitchen room can have an interior attribute of quartz finish, a shower feature of the bathroom can have an interior attribute of plastic finish. In some implementations, each of the interior features can have more than one interior attribute. For example, a cabinet feature of the kitchen room can have interior attributes such as increased height, high quality wood, modern design, and modern color. As another example, a vanity feature of the bathroom can have interior features such as recent styling, recent materials, and plastic finish. In another implementations, two or more interior features can share one or more interior attributes. For example, a cabinet feature and a counter feature of the kitchen can both have interior attributes such as builder-grade finishes, relatively recent styling, relatively recent materials, and not high-end. In other implementations, the rooms identified by the valuation system can have features all with the same interior attribute. For example, a home may have bathroom, kitchen, bedroom, living room features all with the interior attribute of upgraded quality.

The valuation system can be configured to identify exterior features, including adjacent buildings/structures, trees, other foliage, power lines, roadways, and the like. The valuation system can be configured to identify exterior features from outdoor (i.e., aerial) photos, such as outdoor property images, satellite images, or drone images. The valuation system is further configured to select exterior features that can influence a value of a property and then correlate these selected exterior features with interior features to enrich the valuation of the property. In some implementations, the valuation system can be configured to identify objects (e.g., buildings, trees, foliage) viewable from one or more property windows. For example, the valuation system can identify a window feature and determine if the window is substantially obstructed with foliage, substantially obstructed with a building, unobstructed, and so on. The obstruction can be any exterior feature correlated with the window feature that can affect the valuation of the property. The valuation system can also be configured to estimate shade coverage based on outdoor (i.e., aerial) images, and determine interior property features associated with the estimated shade coverage area. For example, the valuation system can determine if a window receives direct sunlight, indirect sunlight, partial shade, or full shade. The valuation system can be configured to identify adjacent buildings/objects associated with interior features. For example, the distance to an adjacent property from a bedroom can be identified by the valuation system.

The valuation system is configured to use the identified interior/exterior features to determine a computer-generated property valuation. In some implementations, the property valuation includes a price, such as an estimated list or sale price. In other implementations, the property valuation generates a relative score reflecting the interior/exterior features, which can be combined with a neighborhood price range to determine an estimated list or sale price. In some implementations, the valuation system further considers supplemental property data, such as audio data. For example, the valuation system can identify noise features from the audio data including airplane noise, construction noise, roadway noise, water noise, wildlife noises, and the like. The valuation system can further adjust the valuation based on the noise features of audio data.

FIG. 1 is a block diagram showing some of the components typically incorporated in at least some of the computer systems and other devices on which the valuation system operates. In various implementations, these computer systems and other devices can include server computer systems, desktop computer systems, laptop computer systems, mobile computing devices, smartphones, tablets, etc. In various implementations, the computer systems and devices include zero or more of each of the following: at least one processor (e.g., central processing unit ("CPU")) 101 for executing computer programs; at least one computer memory 102 for storing programs, data, and/or executable instructions while they are being used, including the recommendation system and associated data, an operating system including a kernel, and device drivers; at least one persistent storage device 103, such as a hard drive or flash drive for persistently storing programs and data; at least one computer-readable media drive 104 that is a tangible storage means that does not include a transitory, propagating signal, such as a floppy, CD-ROM, or DVD drive, for reading programs and data stored on a computer-readable medium; and at least one network connection 105 for connecting the computer system to other computer systems to send and/or receive data, such as via the Internet or another network and its networking hardware, such as switches, routers, repeaters, electrical cables and optical fibers, light emitters and receivers, radio transmitters and receivers, and the like. While computer systems configured as described above are typically used to support the operation of the valuation system, those skilled in the art will appreciate that the valuation system can be implemented using devices of various types and configurations, and having various components.

Valuation computer system 100 implements a number of software modules, stored in memory 102, to facilitate the operation of the valuation system. Computer vision (Computer Vision) module 106 is configured to identify objects/features in image data (e.g., still photos, videos, etc.). In some implementations, the computer vision module 106 is configured to identify any number of regions in a photo, and further to determine a number of tags associated with each region. For example, the regions can be rectangular areas of a photo. Tags associated with a region can include a window, door, tree, rooftop, roadway, sink, cabinet, and so on. In some implementations, computer vision module 106 includes a machine learning model (e.g., a neural network, decision tree, random forest, linear regression, logistic regression, gradient boosting, ensemble methods, Bayesian network, support vector machine, genetic algorithm, evolutionary programming, and so on) trained on pre-tagged images. For example, computer vision module 106 can include a machine learning model trained on property image data (e.g., interior property photos, outdoor property photos, aerial property photos) tagged with features (e.g., windows, doors) that can include interior image data. Interior/exterior property features are further described herein. In other implementations, computer vision module 106 implements an application programming interface (API) to communicate with a computer vision service, such as a cloud machine learning platform.

Machine learning module 110 can implement any combination of artificial neural networks, decision trees, random forests, linear regression, logistic regression, gradient boosting, ensemble methods, Bayesian networks, support vector machines, genetic algorithms, evolutionary programming, and so on, to generate relationship models. Machine learning module 110 is configured to, at least, generate property valuations based on annotated image data, as described at FIG. 4. In some implementations, machine learning module 110 implements a regression algorithm, and machine learning module 110 has been trained on manual valuations of image data. In other implementations, machine learning module 110 implements a neural network. Additionally, machine learning module 110 can implement multiple machine learning models to separately evaluate/value portions of the annotated image data (as described at FIG. 4). In several implementations, a subset of the annotated image data is processed by the machine learning module 110 based on, for example, elements identified in the annotated image data (e.g., element identity, elements density, number of elements, element type, etc.), priority of elements, resolution (e.g., pixel density) of image data, quality of image data, source of image data, reliability indicators of image data sources.

Figure 2:
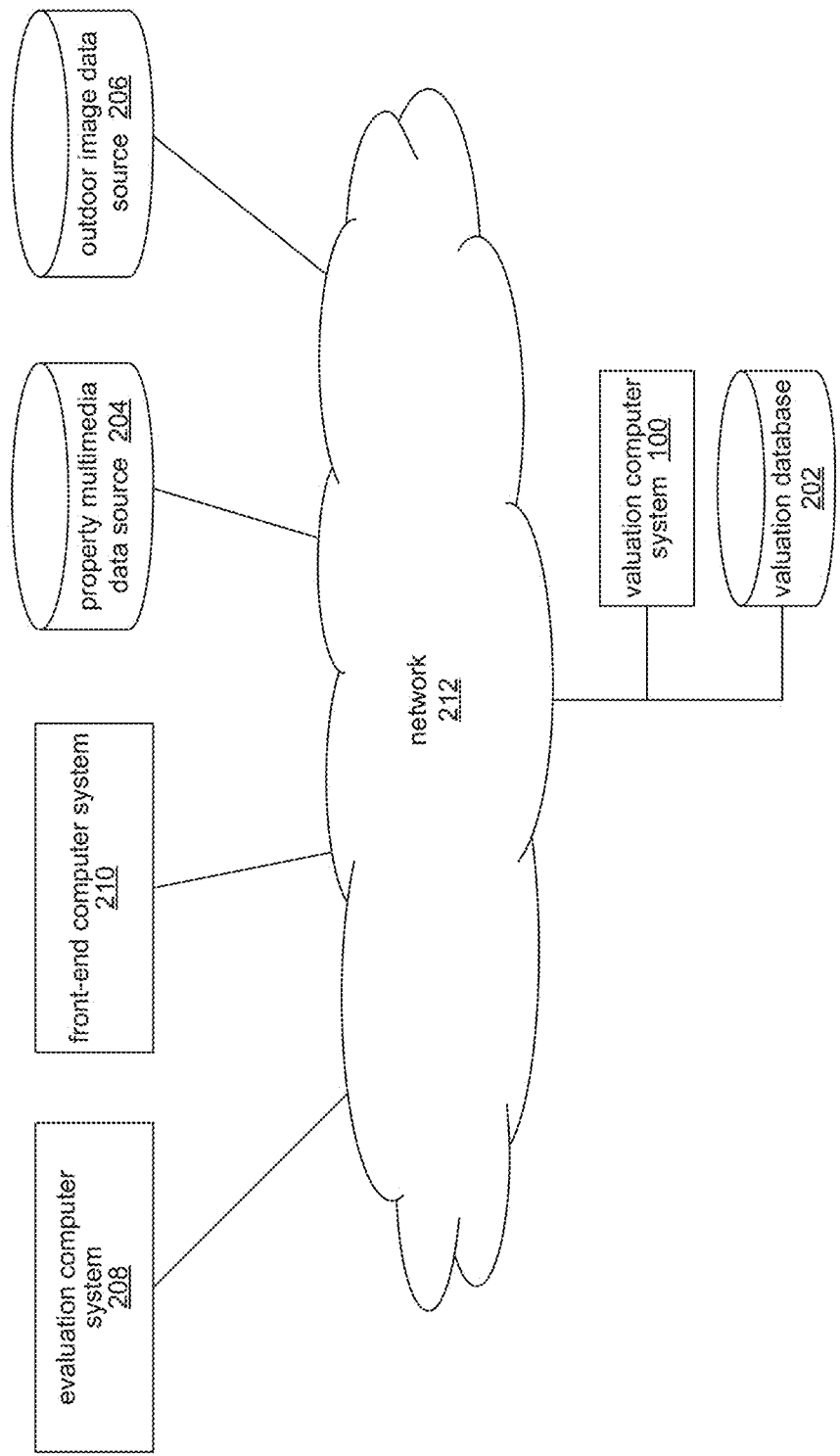
FIG. 2 is a system diagram illustrating an example of a computing environment in which the valuation system operates in some implementations.

FIG. 2 is a system diagram illustrating an example of a computing environment in which the valuation system operates in some implementations. Overall, valuation computer system 100 generates property valuations by analyzing image data, such as aerial/outdoor views of the property, and interior photos. Valuation computer system 100 is configured to retrieve property-related data (e.g., images, videos, audio) from any number of data sources. In the illustrated implementation, valuation computer system 100 is in communication with property multimedia data source 204, and outdoor image data source 206.

In some implementations, property multimedia data source 204 stores interior photos of a property. In other implementations, property multimedia data source 204 can further store complex multimedia data associated with a property, such as panoramic images, 3D images, photos, videos, and audio recordings. Valuation computer system 100 can be configured to retrieve image data from property multimedia data source 204 using a property identifier, property mailing address, geographic coordinate, plot identifier, and so on.

Outdoor image data source 206 stores aerial/outdoor photos associated with any number of properties. For example, outdoor image data source 206 can store aerial images, satellite images, drone images, data from third-party sources (e.g., Google® images, Google® maps, Bing® maps, etc.) and the like. Valuation computer system 100 can be configured to retrieve outdoor image data based on a property identifier, property mailing address, geographic coordinate, plot identifier, and so on.

Valuation computer system 100 uses the outdoor image data and property multimedia data to generate property valuations. Valuation computer system 100 is configured to store the generated property valuation and any associated artifacts in valuation database 202. Valuation database 202 can be indexed on property identifiers, property mailing addresses, geographic coordinates, plot identifiers, and so on.

Valuation computer system 100 is further connected to evaluator computer system 208 and/or front-end computer system 210. Evaluator computer system 208 can be used by an evaluator (e.g., an appraiser) to review valuations generated by valuation computer system 100. For example, valuation computer system 100 can transmit a generated valuation in addition to the associated property multimedia data and outdoor image data. Thus, the evaluator can assess the performance of the valuation computer system 100.

Valuation computer system 100 is further connected to front-end computer system 210. Valuation computer system 100 is configured to transmit property values to front-end computer system 210. In some implementations, valuation computer system 100 provides a web application program interface (API) to front-end computer system 210, facilitating the programmatic retrieval of property valuations. In other implementations, valuation computer system 100 provides a web interface for browsing properties and associated generated valuations.

Network 212 connects valuation computer system 100 to valuations database 202, evaluator computer system 208, front-end computer system 210, property multimedia data source 204, and outdoor image data source 206. In some implementations, network 212 can be the Internet. In other implementations, network 212 can be a private network, such as a virtual private network (VPN). In yet other implementations, network 212 can include multiple networks. For example, valuation computer system 100 can be connected to front-end computer system 210 over the Internet, to outdoor image data source 206 over a VPN connection, and to valuation database 202 over a private network.

Figure 3:
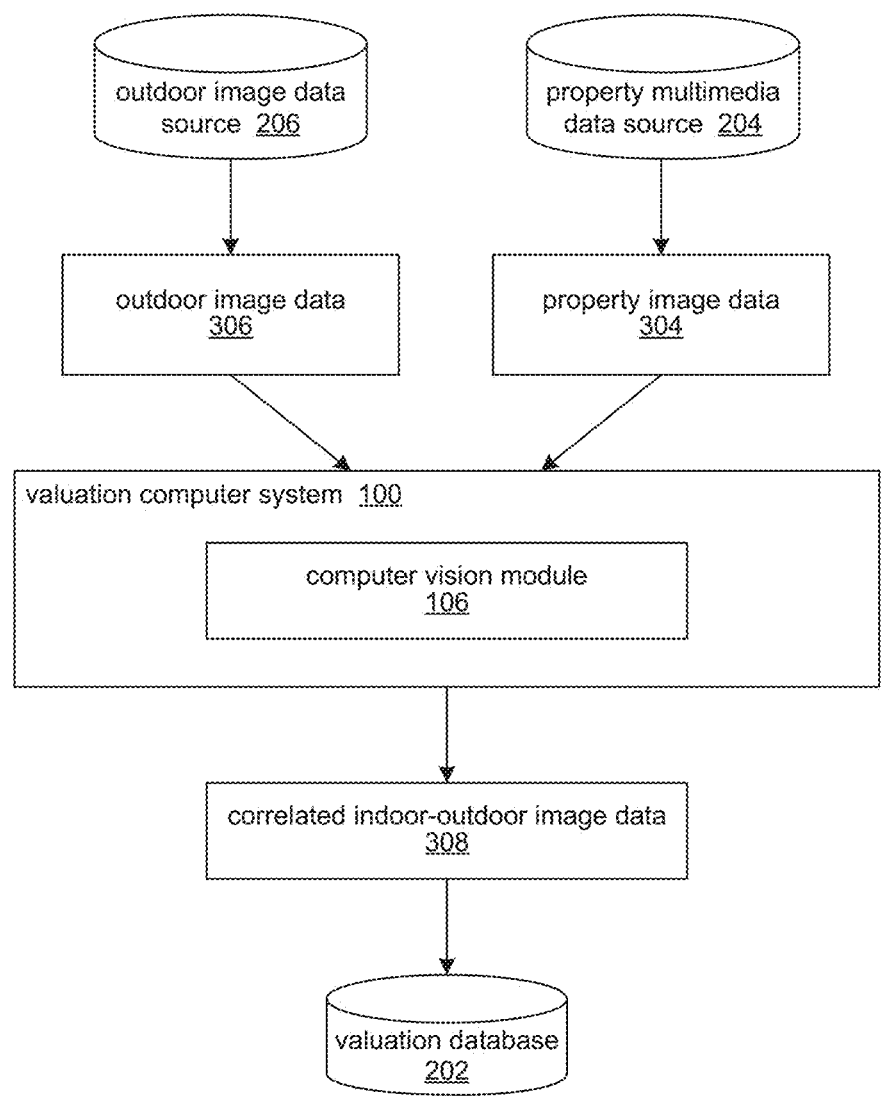
FIG. 3 is a block diagram illustrating a process performed by a valuation system for generating correlated indoor-outdoor image data based on outdoor image data and property image data that can include interior image data.

FIG. 3 is a block diagram illustrating a process performed by a valuation system generating correlated indoor-outdoor image data based on outdoor image data and property image data that can include interior image data. In one implementation, valuation computer system 100 is configured to correlate interior and exterior (e.g., aerial, outdoor, satellite) image data, and to enhance the evaluation of interior features. In another implementation, valuation computer system 100 is configured to identify, using computer vision and machine learning techniques, interior features from image data, and to subsequently generate valuations based on the identified interior features. Thus, in some implementations, valuation computer system 100 is configured to identify interior features based on correlated indoor-outdoor image data. In other words, valuation computer system 100 can identify interior features that span the interior and exterior of a property. For example, the exterior views of windows of a room can be analyzed to at least partially determine the valuation of a residential property.

Valuation computer system 100 is configured to correlate multiple image data from multiple sources. In the example implementation, valuation computer system 100 is configured to correlate interior images of a property to aerial photos (e.g., outdoor images, satellite and drone imagery, and 360-degree panoramic images). Overall, valuation computer system 100 fits an outline of the property to a floor plan of the property. In some implementations, computer vision module 106 is configured to determine the outline of the property from the outdoor (e.g., aerial) photos using computer vision techniques. For example, computer vision module 106 can be trained to identify roofing. Subsequently, a floor plan is fit (e.g., scaled, rotated) to the determined outline. After the image data is correlated, valuation computer system 100 can determine any number of associated areas from exterior image data in response to an area of interior image data, and vice versa. In other words, a point on an interior image can be mapped to at least one point on an exterior (e.g., outdoor, aerial) image.

More specifically, valuation computer system 100 retrieves outdoor image data 306 from outdoor image data source 206, and property image data 304 from property multimedia data source 204. In the example implementation, property image data 304 includes multiple panoramic images of individual interior rooms of a property. Outdoor image data 306 includes at least one outdoor/aerial photo of the same property. In several implementations, outdoor image data 306 can be gathered from external sources, such as Google® images, Google® maps, other sources that maintain data about the exterior (and/or interior) of a property, and so on. In the example implementation, property image data 304 includes interior images of a property. Property image data 304 can include, interior photos, interior panoramic photos, interior videos (e.g., video walkthroughs), and so on.

Outdoor data includes satellite images, drone footage, 360-degree panoramic images, stereo images, regular camera images, LIDAR, and thermal images. Microphones (or binaural microphones for sound directionality) can also be used to sample noise levels outside the house. Valuation computer system 100 implements computer vision module 106 to generate correlated indoor-outdoor image data 308 based on the outdoor image data 306 and property image data 304. Generally, computer vision module 106 identifies common features between outdoor image data 306 and property image data 304, such that locations in property image data 304 can be mapped to outdoor image data 306.

Computer vision module 106 generates a virtual floor plan based on property image data 304. Computer vision module 106 is configured to segment property image data 304 into any number of rooms, and identify floor plan features (e.g., windows, doors, doorways, openings) in property image data 304. Further, computer vision module 106 utilizes the floor plan features to determine a relative location of the identified rooms, resulting in a generated floor plan. In some implementations, computer vision module 106 is configured to identify architectural straps/structural features. For example, computer vision module 106 can identify doorways, hallways, entryways, passages, and sliding doors. To identify architectural straps/structural features, computer vision module 106 can include a machine learning model (e.g., neural network) trained on images containing annotated regions (e.g. rectangle areas, segments) pre-tagged with associated architectural straps/structural features. The regions identify where in the image the architectural straps/structural features are, and the tag for each region identifies what the specific architectural strap/structural feature is in the region. For example, the machine learning model of the computer vision module 106 can be trained on interior photos/panoramic photos that have bounding boxes or segmentation masks each pre-tagged as a doorway, hallway, entryway, passage, sliding door, or any architectural strap/structural feature.

In some implementations, machine learning techniques are used to classify a set of interior images into individual rooms. In some implementations, computer vision module 106 can identify any number of interior features in each image, and can subsequently classify the images into rooms based on the features. For example, computer vision module 106 can identify a particular flooring pattern in certain images, and computer vision module 106 can classify those photos as being associated with the same room.

In the example implementation, computer vision module 106 can segment property image data 304 into a kitchen, a living room, and a bedroom. Computer vision module 106 can determine that the kitchen and bedroom each have one interior door, and the living room has two interior doors. Thus, computer vision module 106 can determine the living room is between the bedroom and the kitchen. Additionally, computer vision module 106 can be configured to determine an approximate size and shape for each of the identified rooms. In some implementations, valuation computer system 110 implements computer vision module 106 to determine the approximate size and shape of room. For example, computer vision module 106 can identify the relative lengths of walls, and can identify if a wall is straight or curved.

The floor plan can be aligned with outdoor (e.g., aerial) data by comparing their projected 2D footprints. The alignment can be done using 2D shape matching techniques that are known in the state-of-the-art computer vision community. In addition, locations of doors and windows can be used to aid in the alignment. In some implementations, valuation computer system 110 utilizes compass and GPS data captured during the creation of floor map/tour data to aid in the alignment. Additionally, or alternatively, the floor plan can be aligned based on 2D footprints and window/door matching. For example, windows/doors can be identified from the outdoor image data and can be mapped to features identified from the interior image data.

Computer vision module 106 is configured to compare the virtual floor plan (and property image data 304) to outdoor image data 306. Computer vision module 106 can be configured to determine a property outline. For example, computer vision module 106 can determine the outline of a property based on identifying a roof pattern, flora/foliage around a home on a lot, fencing, other boundary identifying features, neighborhood properties, lot plans, public records of the property (e.g., municipal records, property deeds, etc.), and so on. Computer vision module 106 programmatically finds an orientation of the virtual floor plan consistent with outdoor image data 306. In some implementations, computer vision module 106 can be configured to adjust/scale the virtual floor plan based on outdoor image data 306. Thus, the interior photos (e.g., property image data 304) can be correlated with the outdoor (e.g., aerial) photos (e.g., the relative physical location). Overall, computer vision module 106 outputs correlated indoor-outdoor image data 308, which can be stored in valuation database 202. In some implementations, computer vision module 106 further generates related parameters (e.g., flooring material statistics, walkability scores) and stores the related parameters in valuation database 202.

By correlating these sets of image data, the accuracy of the computer-generated property valuation of the associated property can be increased. The correlation between interior features and exterior features is considered, rather than just viewing them independently. As a result, the generated property valuation is closer to the true market value of the home and is thus not as overvalued or undervalued in comparison to those generated by existing systems. Furthermore, the valuation computer system 100 can make faster property valuations with less training data and generalize better to unseen image data, since it can exploit the underlying relationships between interior features and exterior features. In this manner, the valuation system optimizes computing resources—less computing resources are exhausted, with fewer accesses to databases. Existing systems (e.g. manual systems) may take much longer to develop and train, while often needing lots of data to make accurate property valuations since they do not consider the correlation between interior and exterior features. This is especially the case with homes that have values affected by the underlying relationships between interior features and exterior features. In contrast, the valuation computer system 100, which analyzes the complex effects interior features and exterior features can have on one another, and how they can substantially impact the value, to generate a more accurate property valuation using fewer computing and network resources. For example, the exterior views of a window can be analyzed. More specifically, a window (e.g., an interior feature) can be correlated to a location on an outdoor (e.g., aerial) image, to analyze the view of the window. For example, the location on the outdoor (e.g., aerial) image can be used to identify nearby foliage, objects, buildings, and the like, to determine if the window view will be obstructed. A window view with an undesirable obstruction can lower the property value. As another example, the orientation of the window can be determined using the outdoor (e.g., aerial) image to calculate the sunlight times and intensity. The window's orientation with respect to sunlight can also affect the property value, which is described more in detail in FIG. 14. The identification of interior features is further described in relation to, at least, FIGS. 4 and 7.

In some implementations, computer vision module 106 is further configured for sunlight simulation to generate a shade projection based on correlated indoor-outdoor image data 308. Computer vision module 106 can be configured to identify external features (e.g., external objects) from outdoor image data (e.g., trees, adjacent buildings, foliage, power lines, etc.). To identify external features, computer vision module 106 can include a machine learning model (e.g., neural network) trained on images containing annotated regions (e.g. rectangle areas, segments) pre-tagged with associated external features. The regions identify where in the image the external features are, and the tag for each region identifies what the specific external feature is in the region. For example, the machine learning model of the computer vision module 106 can be trained on outdoor/aerial photos that have bounding boxes or segmentation masks each pre-tagged as a tree, adjacent building, foliage, power line, or any external feature. Computer vision module 106 subsequently generates shade estimations for the external features. For example, computer vision module 106 can identify an approximate region of shade associated with a tree for an afternoon time. As another example, computer vision module 106 can identify an approximate region of shade associated with an adjacent building for a morning time. Multiple approximate regions of shade can be superimposed onto correlated indoor-outdoor image data 308.

Figure 4:
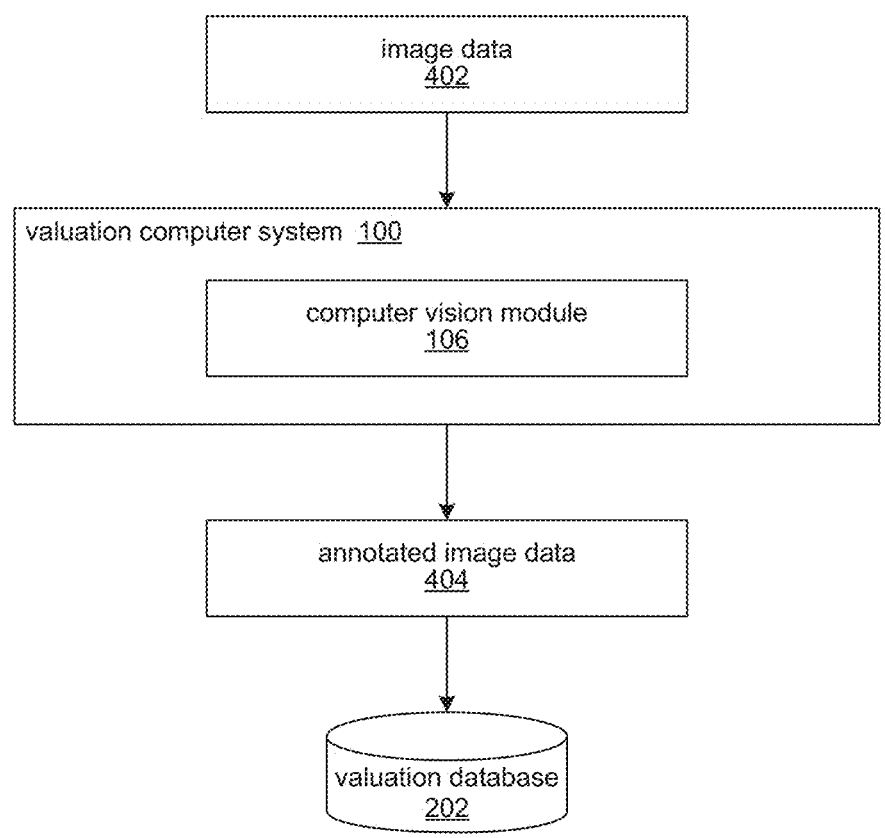
FIG. 4 is a block diagram illustrating a process performed by a valuation system for generating annotated image data using a computer vision software module.

FIG. 4 is a block diagram illustrating a process performed by a valuation system generating annotated image data using a computer vision software module. Valuation computer system 100 identifies property features (e.g., appliances, fixtures, building materials) in image data. In some implementations, the image data can include interior photos retrieved from property multimedia data source 204. In the example implementation, valuation computer system 100 identifies property features in correlated indoor-outdoor image data 308. In other words, valuation computer system 100 can identify property features in image data that have been "pre-processed" to correlate interior and exterior (i.e., aerial) image data. Thus, the accuracy of the feature identification can be increased through the use of correlated indoor-outdoor image data 308.

In some implementations, annotated image data (e.g., annotated image data 404) includes images and any number of corresponding regions, each region having any number of tags. For example, an image can include a first region with the tag 'window'. As another example, a second image can include a first region with the tags 'sink' and 'granite'. As yet another example, a third image can include two regions each tagged with 'door'. Computer vision module 106 is configured to determine regions and tags for image data, such as interior image data, and outdoor (e.g., exterior, aerial) image data. To determine regions and tags, computer vision module 106 can include a machine learning model (e.g., neural network) trained on images containing annotated regions (e.g. rectangle areas, segments) pre-tagged with associated property features. The regions identify where the property features are, and the tag for each region identifies what the specific property features are in the region. In some implementations, the machine learning model can be a detection model where given labeled images with bounding boxes and tags of property features, the model can be trained to predict the bounding boxes and tags of property features in unseen images. In other implementations, computer vision module 106 includes an image segmentation component where given images with labeled pixel-level masks and tags of property features, the image segmentation component can learn to predict pixel-level masks and tags of property features in unseen images. For example, the machine learning model of the computer vision module 106 can be trained on annotated interior photos/panoramic photos, where an example can be an interior panoramic photo containing a first bounding box or segmentation mask with the tags 'sink' and 'granite' and a second bounding box or segmentation mask with the tag 'window'. In other implementations, annotated image data includes any combination of JSON data, XML data, image metadata, identified regions/areas, tags, markups, annotations, and so on. In some implementations, computer vision module 106 generates annotated image data 404 based on training data of manually annotated (e.g., annotated by humans) images.

Valuation computer system 100 implements computer vision module 106 to identify property features in image data 402. Computer vision module 106 is configured to identify interior features of a property, based on image data 402. Computer vision module 106 can further identify attributes of interior features including the size, style, placement, material, quality, condition, etc. Interior features can include cabinetry, windows, doors, entryways, fireplaces, moldings, flooring, ceilings, and so on. For example, given a specific interior image, computer vision module 106 can identify flooring made out of wood. As another example, computer vision module 106 can identify cabinetry and a large bay window based on a photo of a living room. As yet another example, computer vision module 106 can identify multiple sinks, granite counters, and a large tub based on a photo of a bathroom. Overall, computer vision module 106 annotates images (e.g., image data) with identified interior features, and each identified interior features can have any numbers of attributes (e.g., material, size). In some implementations, image data 402 is directly fed to valuations database 202.

In some implementations, valuation computer system 100 is configured to identify interior property features based on correlated indoor-outdoor image data (e.g., combined interior and aerial images). Valuation computer system 100 can identify the architectural style of a home. For example, valuation computer system 100 can identify a craftsman style home in response to a rectangular floor plan including a porch, the appearance of tapered columns in the property image data, and wide moldings around doors identified in the property data. As another example, valuation computer system 100 can identify a colonial style home in response to a wide and shallow property outline and image data including a stairway. To identify the architectural style of a home, the valuation computer system 100 can implement computer vision techniques to isolate interior property features/attributes and match them against templates of interior property features/attributes annotated with architectural styles. The templates can come from annotated image data. A match score for an interior property feature/attribute and each of the templates can be computed to indicate the degree of similarity. The template that the interior property feature/attribute has the highest match score with can determine the architectural style. The individual architectural styles of all the interior features/attributes can be evaluated to determine an overall architectural style for the home. The architectural style that is identified most frequently in individual interior features/attributes of the home can determine architectural style of the home, or the architectural style that is identified in the greatest number of rooms in the home can determine the architectural style of the home. In some implementations, to identify the architectural style, the computer vision module 106 can include a machine learning model trained on sets of interior images for homes pre-tagged with architectural styles. The machine learning model can learn from the training data to isolate regions of interior features in images, identify an architectural style for features in each region, and determine the architectural feature that is identified most often in the sets of interior images. For example, the machine learning model can be trained on sets of interior images pre-tagged as colonial style, craftsman style, modern style, Victorian style, medieval style, or any architectural style.

In some implementations, valuation computer system 100 is configured to classify floor plans using machine learning techniques. Valuation computer system 100 can implement computer vision module 106 to classify floor plans as "open," "traditional," "split-level," and so on. For example, computer vision module 106 can identify a large irregular shaped room on the main level of a property (e.g., a combined kitchen, dining room, and living room), and subsequently classify the floor plan as "open." To classify floor plans, the computer vision module 106 can include a machine learning model trained on generated floor plans pre-tagged with the floor plan class: "open", "traditional", "split-level", etc. The machine learning model can learn from the training data to classify a floor plan by examining the rooms of the floor plan and their relation to one another. For example, the machine learning model can be trained on annotated floor plans, such as a floor plan containing a combined kitchen, dining room, and living room with the tag class "open". Valuation computer system 100 can further classify floor plans based on the number, size, and type of rooms. For example, valuation computer system 100 can classify floor plans as "large bedrooms," "small bedrooms," "walk in closet," "shared bathroom," and so on. As another example, valuation computer system 100 can determine the dimensions of rooms. To classify floor plans, the computer vision module 106 can include a machine learning model trained on generated floor plans pre-tagged with room numbers, sizes, and types. The machine learning model can learn from the training data to identify the number of rooms based on the number of separate areas in a floor plan, how big or small the rooms are depending on the measurements of the rooms, and the type of room based on interior images related to the room of a floor plan. For example, the machine learning model can be trained on floor plans pre-tagged as "large bedroom", "small bedroom", "walk in closet", "shared bathroom", or any combination of number, size, and type of the room.

"Walkability" between rooms can also be considered for valuation, i.e., how easy to navigate from one room (e.g., bedroom) to another (e.g., bathroom) based on distance and path shape (sharp turns are less favored). Valuation computer system 100 can compute a walkability score for each room of the floor plan. Rooms with less distance and more favorable path shapes (e.g. straight across, few turns) can be assigned a higher walkability score, while rooms with less favorable path shapes (e.g. several sharp turns) can be assigned a lower walkability score. The individual walkability scores for all the rooms of the floor plan can be combined to compute an overall walkability score for the home. When evaluated by the machine learning module 110, a home with a high overall walkability score may receive a higher valuation since it is more accessible and easier to navigate for residents (e.g. open floor plan with easy navigation). On the other hand, a home with a low overall walkability score may receive a lower valuation since it is less accessible and hard to navigate for residents (e.g. closed floor plan).

FIG. 4 illustrates the general operation of computer vision module 106. The identification of interior features is further described in relation to, at least, FIG. 7. In some implementations, computer vision module 106 is configured to identify exterior features (e.g., exterior objects, trees, roadways) in outdoor image data. Exterior features include trees, foliage, adjacent buildings, adjacent roadways, power lines and other infrastructure, water features, and so on. For example, computer vision module 106 can be configured to identify any number of adjacent buildings, roadways, and individual trees based on a satellite image of a property. In some implementations, computer vision module 106 is further configured to identify attributes of the exterior features, such as the number of lanes of a roadway, the approximate height and shape of a tree, and so on. In other words, outdoor image data can be annotated with identified exterior features by computer vision module 106. These exterior features can be incorporated into the correlated indoor-outdoor image data, such that interior features can be related to exterior features. The correlated indoor-outdoor image data can include the virtual floor plan aligned to outdoor image data described in FIG. 3 and FIG. 6 that allows correlations to be inferred between interior features and exterior features. Computer vision module 106 can identify interior and exterior features, and valuation computer system 100 can infer the correlations between the identified interior and exterior features by determining the direction and placement of external features located relative to internal features and vice versa in the aligned floor plan. For example, a bedroom (e.g., an interior feature) being near a highway (e.g., an exterior feature), a power line (e.g., exterior feature) being viewable from the window (e.g., exterior feature) of the living room, or the shadow of a tree reducing the brightness of a kitchen. For example, a number of exterior features (e.g., trees) can be identified as being physically proximate to an interior feature (e.g., a window).

Valuation computer system 100 generates annotated image data 404 in response to the interior features identified in image data 402. In some implementations, valuation computer system 100 stores the identified interior features in a data structure such as a JSON or XML file. In other implementations, valuation computer system 100 stores the identified features within an image data structure. Valuation computer system 100 is also configured to store annotated image data 404 in a database, such as valuation database 202.

Figure 5:
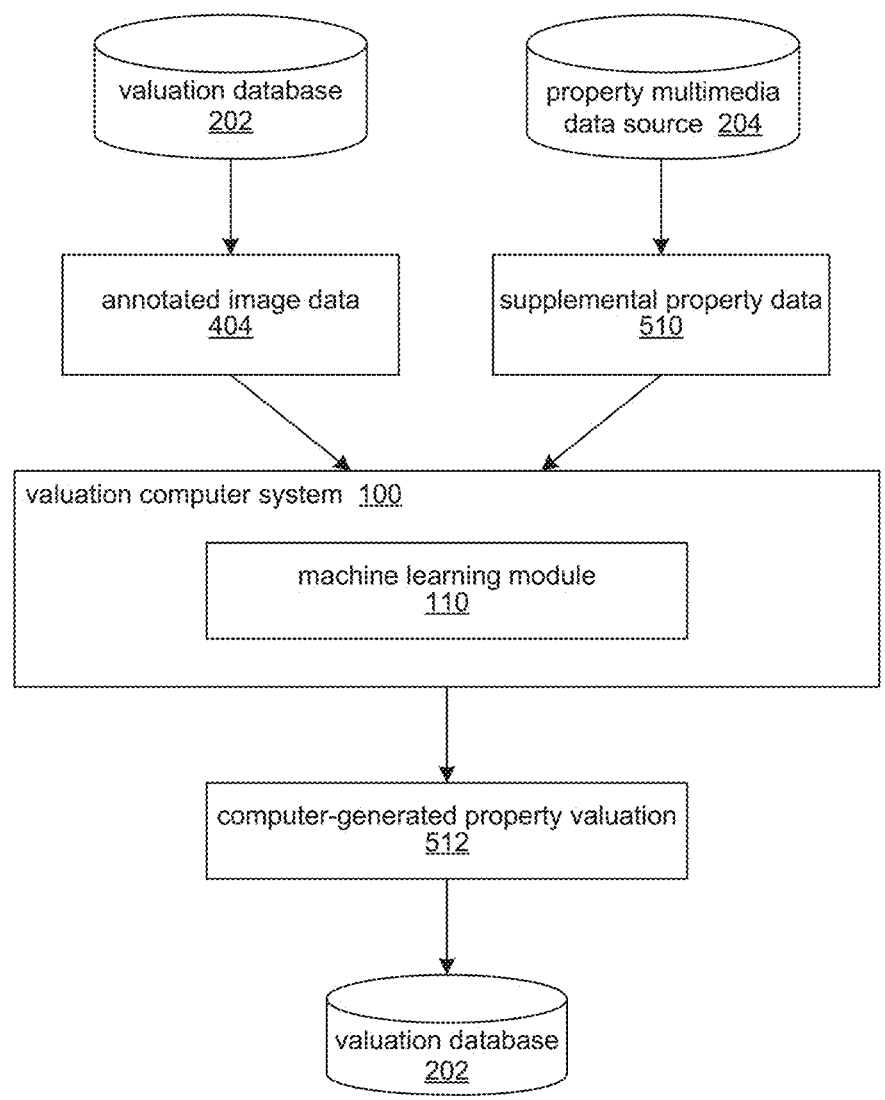
FIG. 5 is a block diagram illustrating a process performed by a valuation system for determining a computer-generated property valuation using a machine learning software module.

FIG. 5 is a block diagram illustrating a process performed by a valuation system determining a computer-generated property valuation using a machine learning software module. Valuation computer system 100 determines a valuation (e.g., estimated selling price) for a real estate property using property image data 304. In other words, valuation computer system 100 utilizes the identified features in the image data (e.g., the property image data 304) to generate a property valuation.

Valuation computer system 100 implements machine learning module 110. Machine learning module 110 is configured to retrieve property image data 304 from valuation database 202. In some implementations, machine learning module 110 further retrieves supplemental property data 510 from property multimedia data source 204. Supplemental property data 510 can include audio data, such as ambient noise recordings (e.g., traffic data, air traffic data, etc.), privacy data (e.g., proximity of home to neighbors, homes, line of vision data, etc.), flow of home (e.g., open floor plan, closed floor plan, light flow within home, etc.), and so on. In several implementations, supplemental property data 510 includes information gathered by experience of (and/or with) property appraisals. For example, supplemental property data 510 comprises a list of features (and/or their attributes) identified by home appraisers as being important for home valuation. Supplemental property data 510 can further comprise data collected by IoT devices/sensors (e.g., cameras, depth sensors such as LIDAR and Kinect, microphones, thermal sensors, and so on).

In some implementations, supplemental property data 510 includes user interaction data. Users can interact with property images or a virtual home tour online through a web application, and user interaction data can be recorded. For example, the time spent on a particular part of a tour, saving/sharing particular parts of a tour, and note/highlighting added to parts of the tour can be recorded. This user interaction data can be used by valuation computer system 100 when generating a property valuation.

Machine learning module 110 implements a machine learning algorithm to generate a property valuation based on, at least, the annotated image data. Machine learning module 110 can be trained using training data, such as pairs of annotated image data and valuations. For example, machine learning module 110 can "learn," based on training data, that specific combinations of features from property image data 304 can have a higher/lower end property valuation. For example, machine learning module 110 can determine a higher property valuation for image data including a "granite" annotation, than for image data including a "laminate" annotation. This is further described in relation to FIG. 8.

In some implementations, machine learning module 110 is configured to match interior features (e.g., interior features) to exterior features using correlated indoor-outdoor image data. Correlated indoor-outdoor image data is described in relation to FIG. 3. For example, machine learning module 110 can identify that a bedroom (e.g., an interior feature) is located close to a highway (e.g., an exterior feature). As another example, machine learning module 110 can determine the objects viewable from a window, such as trees, adjacent buildings, and power lines.

Figure 14:
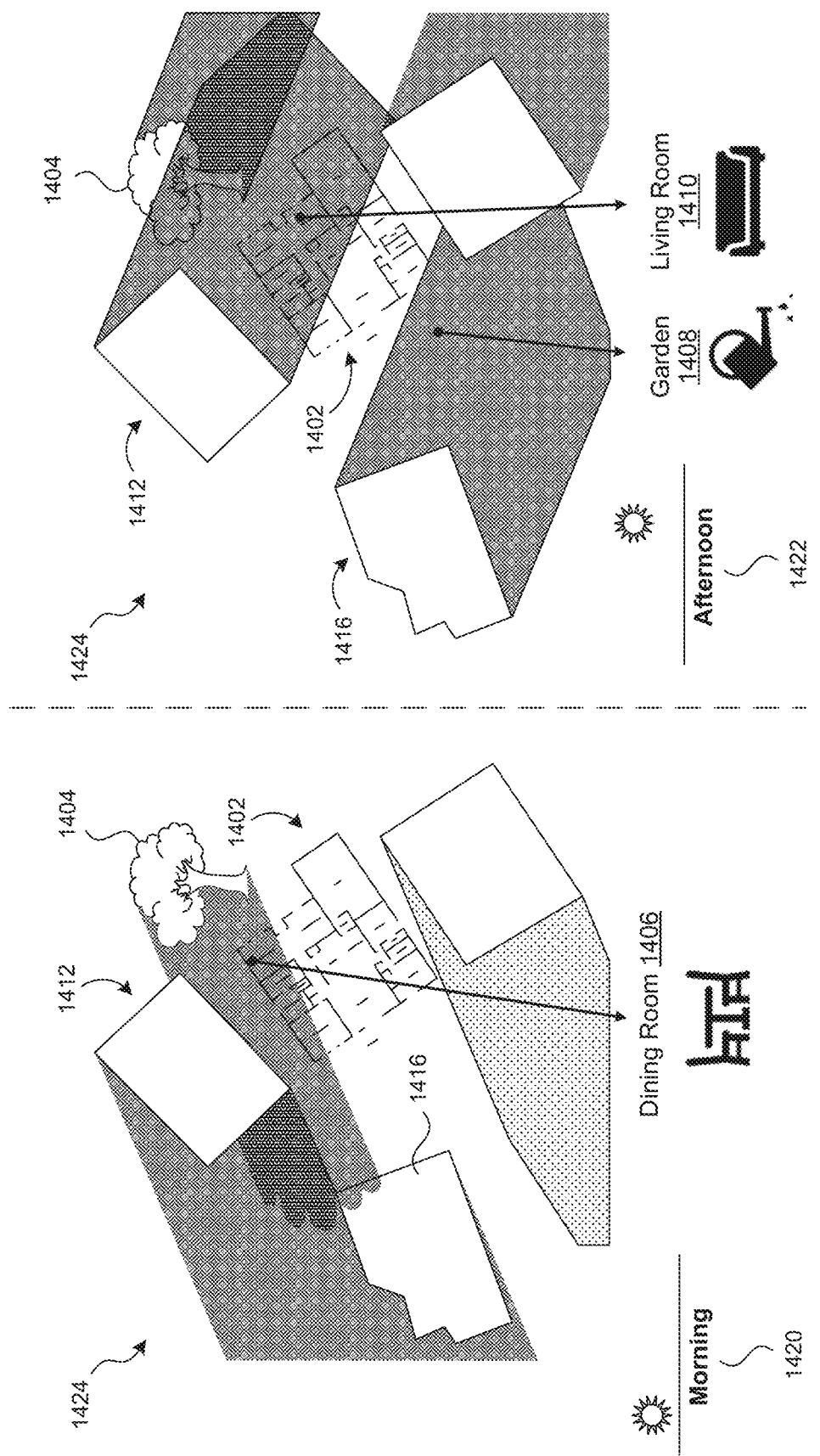
FIG. 14 is block diagram illustrating a process performed by a valuation system for generating shadow projections based on identified exterior features.

More specifically, machine learning module 110 can be configured to determine any number of associated exterior features for an interior feature, using correlated indoor-outdoor image data. Machine learning module 110 can subsequently determine computer generated property valuation 512 based at least in part on this high-quality feature data. For example, machine learning module 110 can generate a more accurate valuation for a living room having a large number of windows, by determining that all the windows have a direct view of an adjacent building. As another example, machine learning module 110 can generate a more accurate increased valuation for a bedroom having a small window, where the small window has an unobstructed view. In some implementations, machine learning module 110 determines computer generated property valuation 512 based at least in part on a shadow projection (as shown in FIG. 14). Machine learning module 110 can determine a geographic area of the property (e.g., Seattle, Arizona), and evaluate the impact of shade/sun features based on the geographic area. For example, shade can be more desirable/valuable in Arizona than Seattle. Machine learning module 110 can further analyze the impact of shadows (e.g., exterior features) on individual rooms (e.g., interior features). A negative impact on rooms can correspond to the property value being adjusted by a negative factor, while a positive impact on rooms can correspond to the property value being adjusted by a positive factor. For example, shadows in Arizona where shade is desired in rooms could correspond to a positive factor, while shadows in Seattle where shade is less desired in rooms could correspond to a negative factor. The degree of the factor can be determined by the number of overlapping shadows (which can determine the strength of the shadows when impacting a room) and dimensions of the shadows. For example, several overlapping shadows can cause a room to be much darker and could correspond to a more negative factor. A shadow that has a smaller dimension, meaning that it covers less of the room, could correspond to a less negative factor. Furthermore, the degree of the shadow's impact and adjustment factor can relate to the room that it affects. For example, exterior trees/shade impacting a kitchen can have a larger negative impact and negative factor on a property valuation than shade impacting an office. Machine learning module 110 can also evaluate the orientation of a property and compare it to the exterior shade features. For example, the shade from nearby trees can be negated by the orientation of the property.

Figure 6:
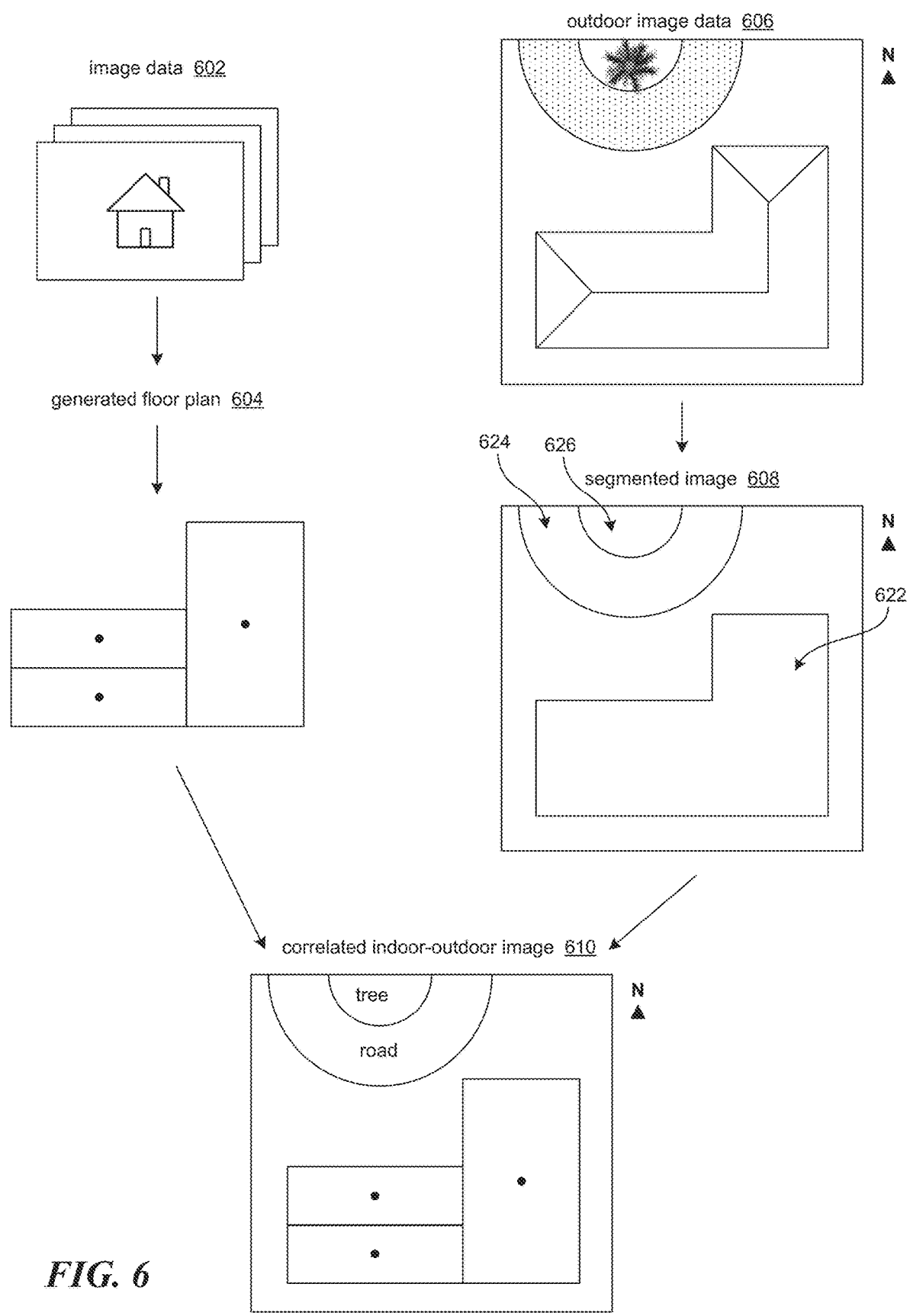
FIG. 6 is a block diagram illustrating a process performed by a valuation system for correlating an outdoor image to a generated floor plan.

Machine learning module 110 can generate property valuation 512 based on flooring statistics, as described in FIG. 6. Also, machine learning module 110 can generate property valuation 512 based on user interaction data, as described above.

Machine learning module 110 stores computer generated property valuation 512 in valuation database 202.

FIG. 6 is a block diagram illustrating a process performed by a valuation system correlating an outdoor (e.g., aerial) image to a generated floor plan. FIG. 6 illustrates the operation of computer vision module 106. FIG. 6 illustrates valuation computer system 100 generating correlated indoor-outdoor image data. In the example implementation, the correlated indoor-outdoor image 610 is generated based on interior photos and aerial (e.g., outdoor, satellite) photos.

Computer vision module 106 is configured to generate floor plan 604 based on image data 602. In the illustrated implementation, floor plan 604 is generated based on multiple panoramic images (i.e., image data 602). Computer vision module 106 is configured to determine the relative size and shape of the multiple rooms represented in image data 602. Additionally, computer vision module 106 identifies structural features (e.g., doors, windows, hallways, doorways), and determines the relative location of the identified rooms using the structural features.

Computer vision module 106 is configured to segment outdoor image 606 into multiple areas (i.e., external features) using computer vision techniques. In the illustrated implementation, segmented image 608 includes identified property area 622, which can be identified based on a roofing pattern from outdoor image 606. Segmented image 608 further includes tree area 626 and road area 624.

Correlated indoor-outdoor image 610 includes generated floor plan 604 superimposed onto segmented image 608. In other words, generated floor plan has been fit to, and replaced, the property area in segmented image 608. Thus, correlated indoor-outdoor image 610 allows for interior features of the property (e.g., windows, rooms) to be correlated to exterior features (e.g., trees, roadways, etc.) from outdoor image 606. Notably, outdoor image 606 has a physical location and orientation, and generated floor plan 604 has been fit to outdoor image 606. Thus, the orientation and location of interior property features (e.g., windows) can be determined from the correlated indoor-outdoor image data. For example, the orientation (e.g., north, south) of a window presented in panoramic image data 602 can be determined using correlated indoor-outdoor image 610.

In some implementations, computer vision module 106 is configured to generate a floor plan including flooring material data. More specifically, valuation computing system 100 can be configured to texture generated floor plan 604 with interior images (e.g., panoramic images from image data 602), such that the flooring of the property is visible on the generated floor plan. For example, in response to image data 602 including an image of a room having carpet, valuation computing system 100 can texture the associated room generated floor plan 604 with an image of the carpet. This process can be repeated for multiple rooms. Computer vision module 106 can be further configured to determine a floor material type (e.g., hardwood, carpet, tiling conch, concrete) for each room of generated floor plan 604. Valuation computing system 100 can further compute flooring statistics for generated floor plan 604, such as the percentage of area/rooms with a specific type of flooring.

Figure 7:
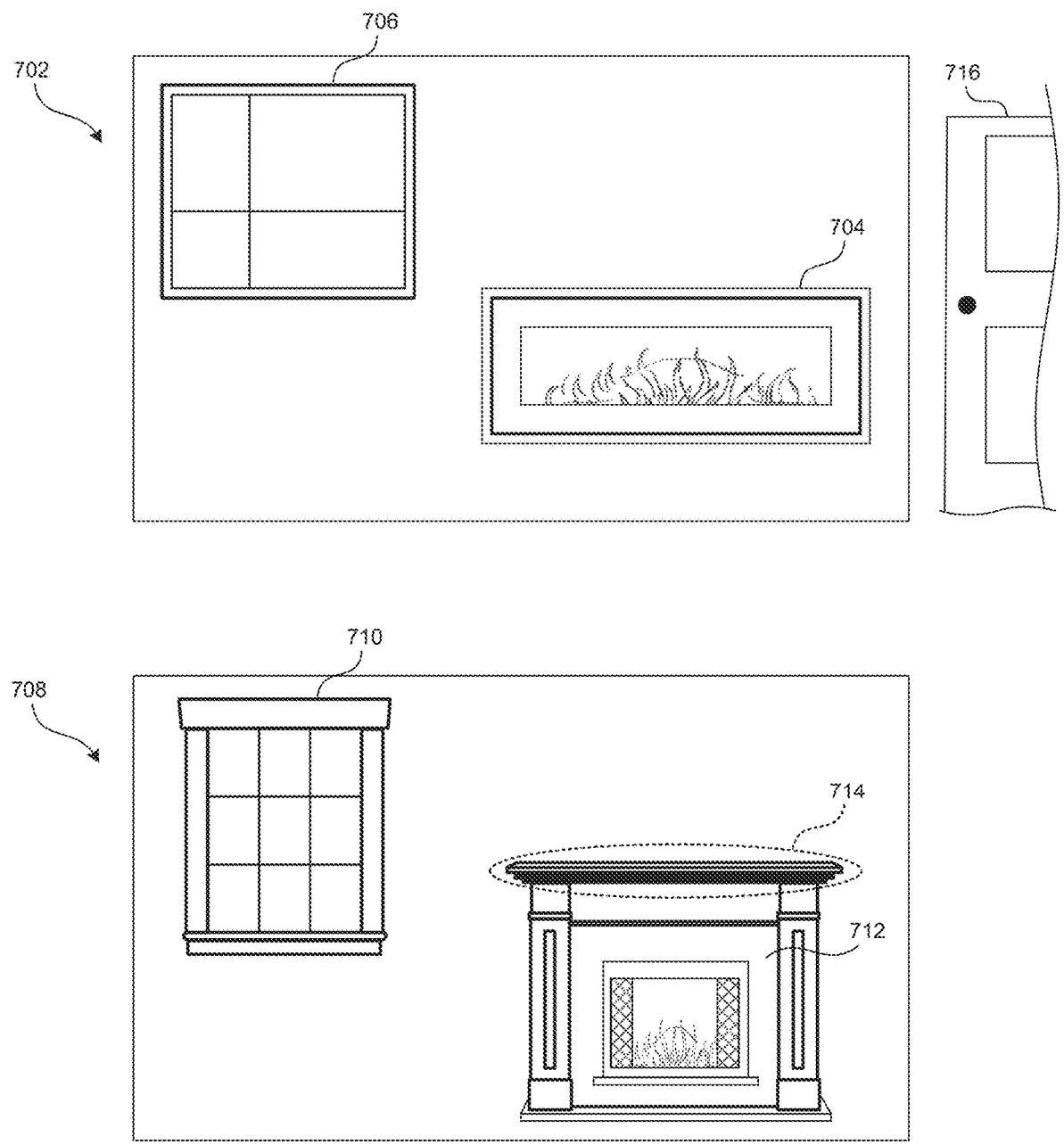
FIG. 7 is a block diagram illustrating a process performed by a valuation system for identifying interior features in image data of a property.

FIG. 7 is a block diagram illustrating a process performed by a valuation system identifying interior features in image data of a property. Computer vision module 106 is configured to identify interior features from image data.

Computer vision module 106 identifies at least two interior features in image 702, window feature 706 and fireplace feature 704. Computer vision module 106 can further determine attributes of window feature 706, such as a modern style and a relatively large size. Computer vision module 106 can also determine fireplace feature 704 is a gas fireplace. Computer visual module 106 can further identify architectural stress/structural features such as doorways, hallways, and passages. For example, computer vision module 160 identified doorway 716.

Computer vision module 106 identifies at least three interior features in image 708, window features 710, mantle feature 714, and fireplace feature 712. Computer vision module 106 can determine window feature 710 is of a colonial style and has a relatively small size. Additionally, computer vision module 106 can determine mantle feature 714 is composed of a marble material, and fireplace 712 is of a wood-burning type.

Images 702 and 708, along with the associated identified features, are provided as an example of interior features that can be identified by computer vision module 106. As described in FIG. 4, computer vision module 106 can identify many types of interior features and attributes of interior features.

Figure 8:
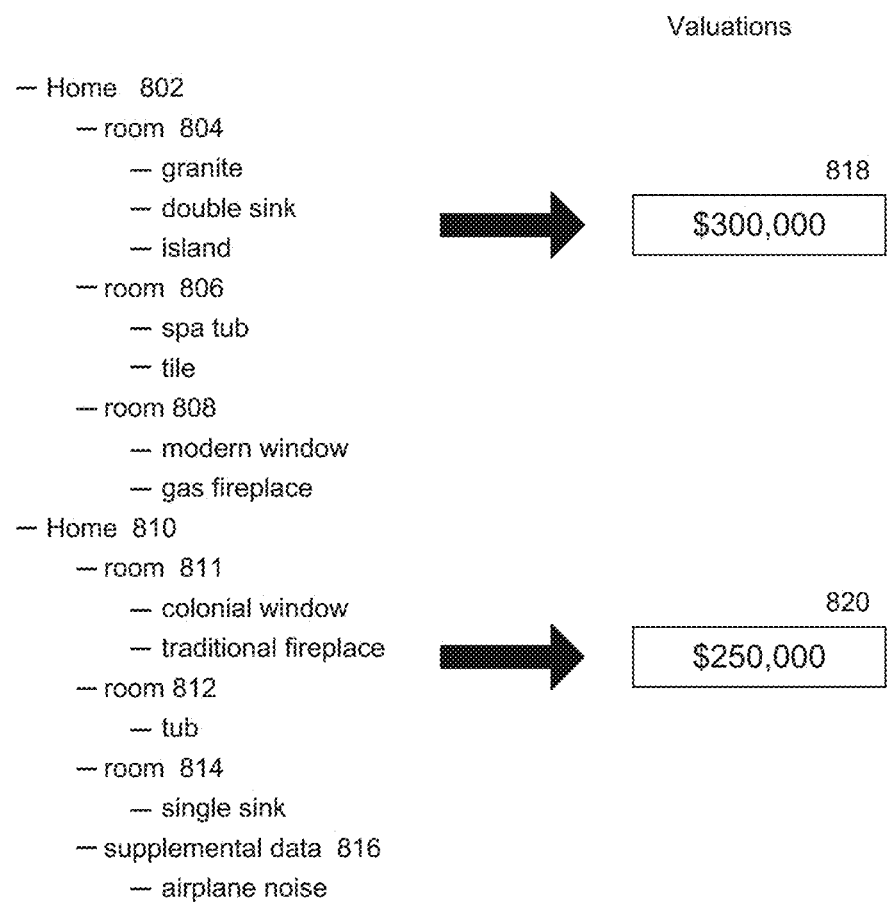
FIG. 8 is a block diagram illustrating a process performed by a valuation system for determining a computer-generated property valuation based on annotated image data.

FIG. 8 is a block diagram illustrating a process performed by a valuation system determining a computer-generated property valuation based on annotated image data. More specifically, FIG. 8 outlines multiple interior features identified by computer vision module 106.

Computer vision module 106 identified interior features and interior attributes in image data associated with home 802. Computer vision module 106 identified three rooms, 804, 806, and 810. Computer vision module 106 identified interior features of the material granite, a double sink fixture, and island cabinetry in room 804. Computer vision module 106 identified a spa tub and tile material in room 806. Further, computer vision module 106 identified a window feature and a gas fireplace feature in room 808, and the window feature further has the attribute of a modern style.

Machine learning module 110 analyzes the identified interior features and interior attributes associated with home 802 and generates a valuation for home 802. In the example implementation, valuation 818 is $300,000 reflecting the premium features and attributes including granite and a spa-style tub.

For comparison, example interior features and interior attributes are provided for a second property, home 810. Computer vision module 106 identifies room 811, 812, and 814. Room 811 has a colonial window and a traditional fireplace. Room 812 has a standard shower/tub combo fixture. Room 814 has a single sink. Additionally, supplemental data 816 includes airplane noise.

Machine learning module 110 generates valuation 820 based on the identified interior features and interior attributes for home 810 and supplemental data 816. Valuation 820 is for $250,000 and reflects the sub-optimal features and attributes of a traditional fireplace, airplane noise, and a single sink, compared to home 802.

Figure 9:
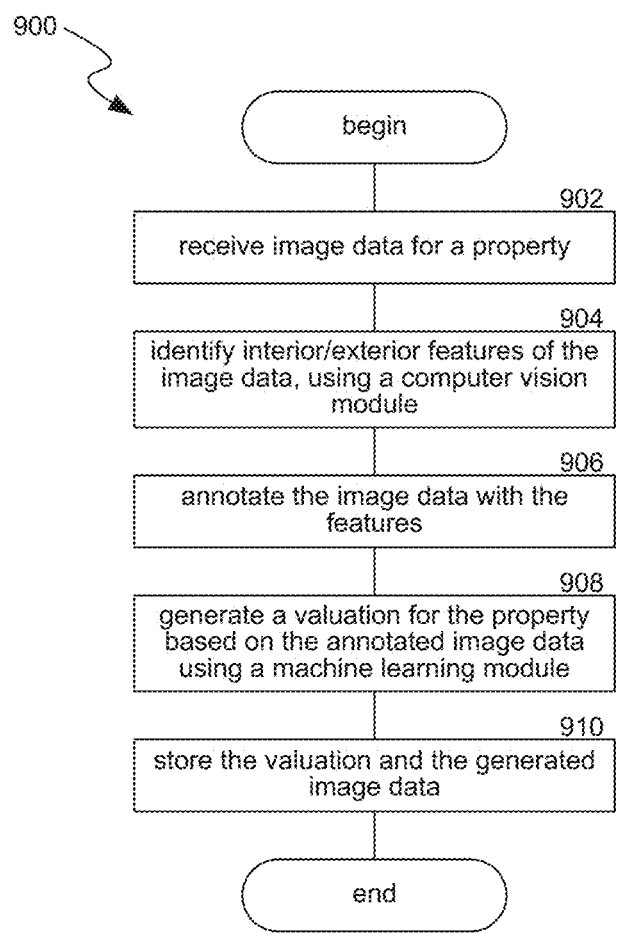
FIG. 9 is a flowchart diagram illustrating a process performed by a valuation system for determining a computer-generated property valuation based on annotated image data.

FIG. 9 is a flowchart diagram illustrating a process performed by a valuation system determining a computer-generated property valuation based on annotated image data. At block 902, process 900 receives image data for a property. In the example implementation, the image data includes multiple panoramic photos of an interior of the property. The property can be of one or more types, such as residential, commercial, mixed use, etc. In some implementations, the image data includes correlated indoor-outdoor image data, that is, image data including correlated interior and exterior images.

At block 904, process 900 identifies interior features of the image data, using a computer vision module. The interior features can include windows, doors, kitchen appliances, cabinetry, molding, and so on. In some implementations, process 900 further determines attributes (e.g., size, style, material, type, condition) of the identified interior features. The attributes can be associated with a room type of the interior features, such as a kitchen or a bathroom.

At block 906, process 900 annotates the image data with the identified interior features (i.e., metadata/tags indicating windows, doors, kitchen appliances, cabinetry, molding, etc.) Process 900 can further store the annotated image data in a valuations database.

At block 908, process 900 generates a valuation for the property based on the annotated image data using a machine learning model. The valuation can include an estimated sale price, a suggested listing price, a property score, a property markup/discount, a relative price adjustment, and so on. Generally, the property valuation aggregates the net value of the identified interior features. In some implementations, block 908 depends directly on block 902, such that the image data from block 902 is directly fed into generating the valuation at block 908.

At block 910, process 900 stores the valuation and the annotated image data in a valuation database.

Figure 10:
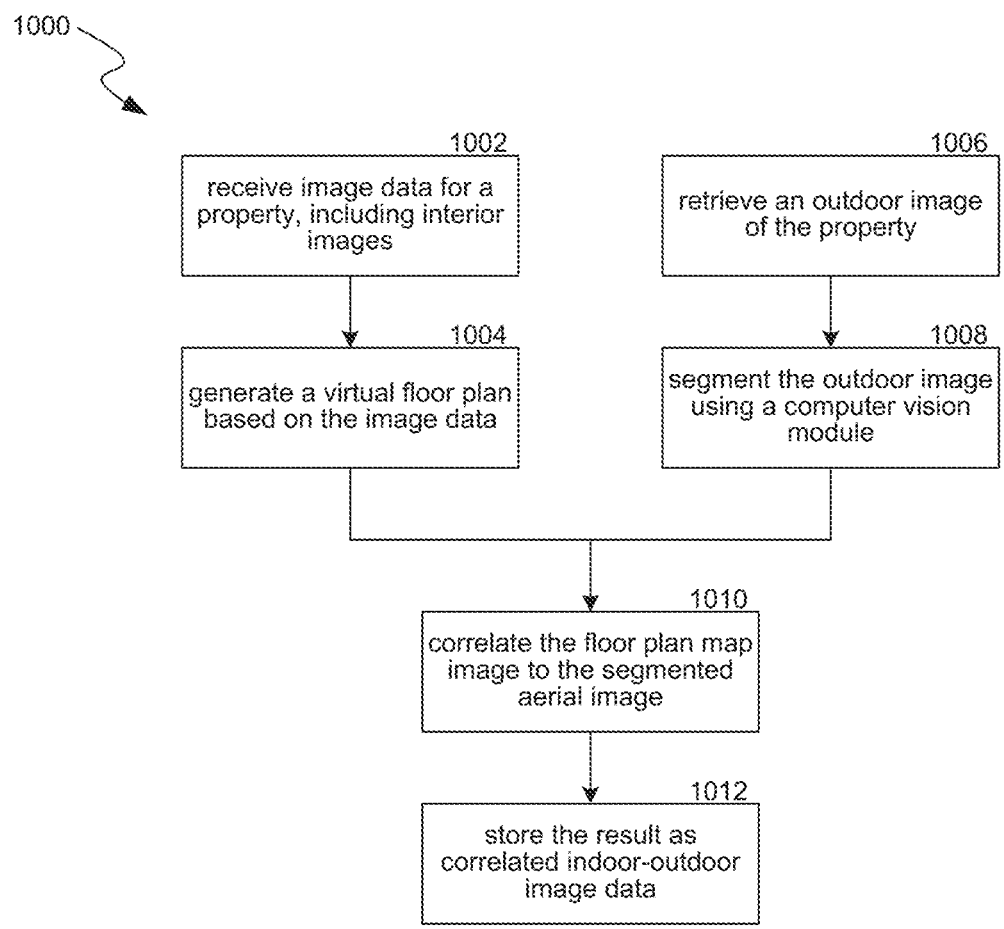
FIG. 10 is a flowchart diagram illustrating a process performed by a valuation system for correlating a floor plan map to an outdoor image.

FIG. 10 is a flowchart diagram illustrating a process performed by a valuation system correlating a floor plan map to an outdoor (e.g., aerial) image. At block 1002, process 1000 receives image data for a property.

At block 1004, process 1000 generates a virtual floor plan based on the image data. For example, images can be segmented into rooms, and structural or floor plan features (e.g., doors, windows, hallways) can be identified to determine the relative location of the rooms.

At block 1006, process 1000 retrieves an outdoor (e.g., aerial) image of the home. The outdoor (e.g., aerial) image can be retrieved using any of a property identifier, mailing address, geographic coordinate, and the like.

At block 1008, process 1000 segments the satellite image using machine learning module 110 and/or computer vision module 106. Segmenting the satellite image determines any number of areas and/or identified features. For example, an outdoor (e.g., aerial) image can be segmented into a property area, roadway areas, commercial areas, adjacent residential property areas, foliage areas, water areas, and the like. Any number of features such as roads, trees, foliage, adjacent buildings, and so on, can be identified in the satellite image.

At block 1010, process 1000 correlates the virtual floor plan to the segmented satellite image. Process 1000 can include automatically fitting the virtual floor plan to a property area identified in the satellite image. Process 1000 can further include scaling/modifying the virtual floor plan to superimpose it onto or fit the property area identified in the outdoor (e.g., aerial) image. Generally, process 1000 generates correlated indoor-outdoor image data that relates the property image data (e.g., interior images of a home) to outdoor image data. In the example implementation, the correlated indoor-outdoor image data includes the virtual floor plan superimposed on the outdoor (e.g., aerial) image. Aligning image data to the virtual floor plan can be done by matching the projected 2D footprints. This operation is similar to 2D shape matching that is a well-researched topic in the computer vision community. In addition, features such as windows and doors can be used for aligning the image data to the floor plan.

At block 1012, process 1000 stores the result as correlated indoor-outdoor image data. Process 1000 can include storing correlated indoor-outdoor image data in a valuation database.

Figure 11:
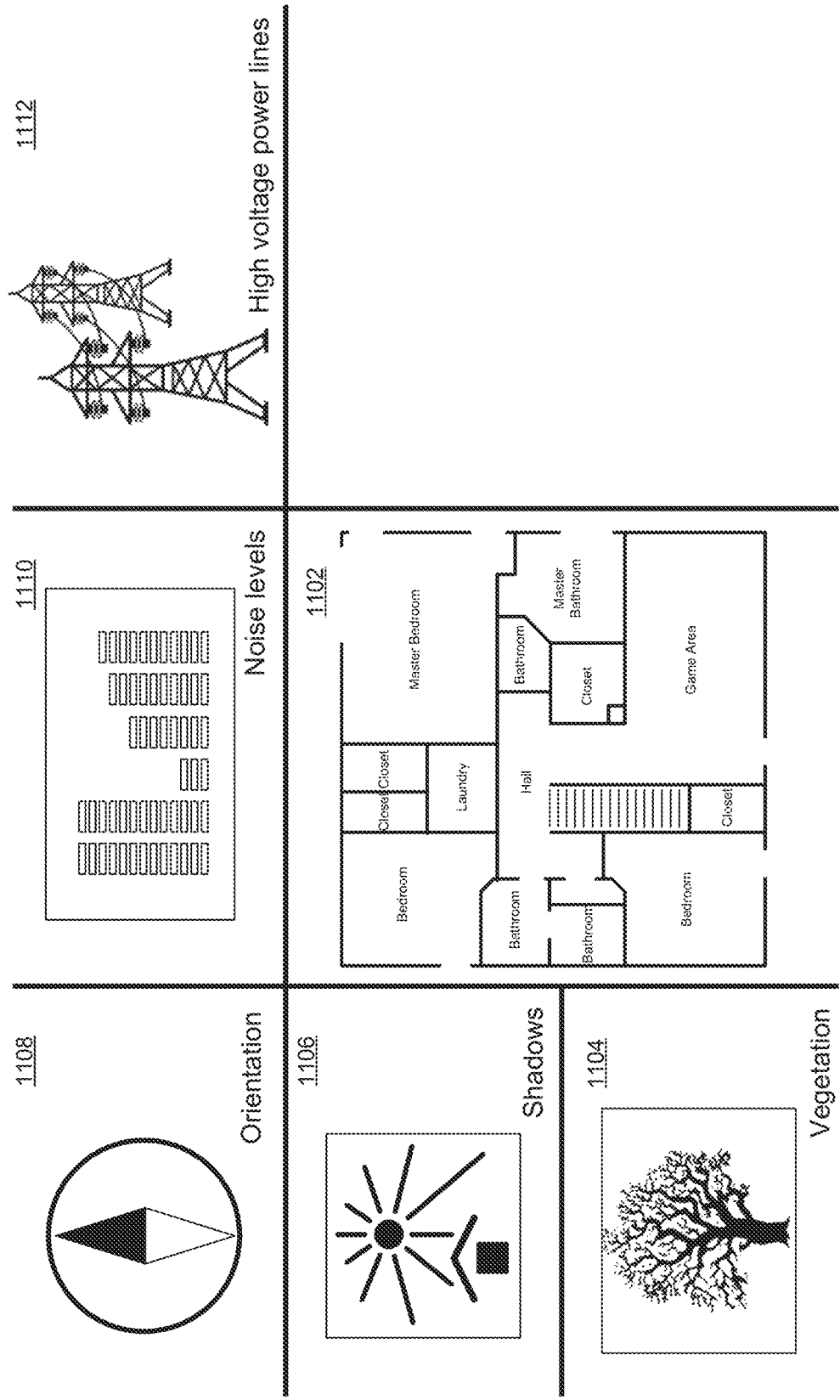
FIG. 11 is block diagram illustrating different internal and external features that can impact a property valuation.

FIG. 11 is a block diagram illustrating different internal and external features (e.g., orientation, noise levels, vegetation, floorplan, etc.) that can impact a property valuation. FIG. 11 includes floor plan 1102 and any number of identified external features. Floor plan 1102 can be computer generated by valuation computer system 100 (shown in FIG. 1) based on property image data, such as interior photos.

Correlating outdoor image data to floor plan 1102 facilitates valuation computer system 100 to identify external features which can impact the property. Vegetation 1104 can impact the view from windows and rooms identified in floor plan 1102. Vegetation 1104 can also determine the timing and relative sunlight/shade experienced by rooms identified in floor plan 1102. Valuation computer system 100 is configured to identify vegetation 1104 and relate it to floor plan 1102. Similarly, shadows 1106 can impact floor plan 1102. For example, adjacent buildings/objects can cast shadows shading a portion of the property. Valuation computer system 100 is configured to identify shadows 1106 and relate them to floor plan 1102.

Shadows 1106 and vegetation 1104 can substantially impact the value of a property. Further, the valuation impact of shadows 1106 and vegetation 1104 can interact with additional property features, such as geographic location, orientations, and home style. For example, features such as vegetation 1104 can increase the valuation of a property in areas with intense natural light, such as Arizona. In contrast, shadows 1106 and vegetation 1104 can negatively impact property valuations in areas with a cooler climate and/or reduced natural sunlight such as Seattle.

In some implementations, valuation computer system 100 is configured to compare shadows 1106 and vegetation 1104 to floorplan 1102. Valuation computer system 100 can be configured to analyze the impact of shadows 1106 on individual rooms of floorplan 1102. Shadows 1106 can have differing impacts on the property valuation based on the impacted room type. For example, shadows impacting a bedroom/nursery can increase a property valuation, while shadows impacting a kitchen can decrease a property valuation.

The orientation of floor plan 1102 can further determine views, relative sunlight intensity, peak sunlight times, and so on. For example, computer valuation system 100 can determine a bedroom of floor plan 1102 receives direct sunlight in the mornings, and a living room of floor plan 1102 receives indirect sunlight. Valuation computer system 100 is configured to identify the orientation 1108 of floor plan 1102.

Valuation computer system 100 is configured to identify industrial objects, such as high voltage power lines 1112. The proximity of industrial objects, such as power lines, can create noise pollution, air pollution, light pollution, and so on. Valuation computer system 100 can be configured to identify industrial objects (e.g., power lines) and their relation to floor plan 1102. In some implementations, valuation computer system 100 can be configured to determine electromagnetic field (EMF) levels for floor plan 1102 based on identified power lines 1112.

Valuation computer system 100 is configured to analyze noise data, such as noise levels 1110. Valuation computer system 100 can identify road noise, airplane noise, construction noise, and so on. Valuation computer system 100 is configured to relate noise levels 1110 to floor plan 1110. For example, the relative noise level for a bedroom of floor plan 1102 can be determined.

Figure 12:
FIG. 12 is block diagram illustrating a process performed by a valuation system for correlating floor plans and outdoor images.
Figure 12:
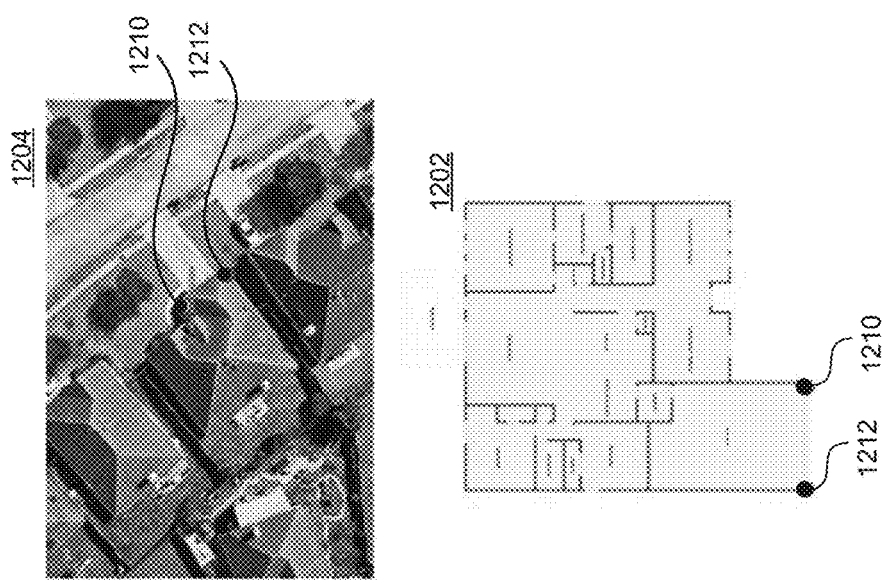

FIG. 12 is a block diagram illustrating a process performed by a valuation system for correlating floor plans and outdoor (e.g., aerial) images. FIG. 12 includes aligning floor plan 1202 to outdoor image 1204. More specifically, valuation computer system 100 (shown in FIG. 1) is configured to identify point features 1210 and 1212 in both outdoor image 1204 and floor plan 1202. Thus, correlated indoor-outdoor image 1206 can be generated, superimposing the details of floor plan 1202 onto outdoor image 1204. Notably, the identification of point features 1210 and 1212 facilitate the orientation/scaling of floor plan 1202 onto outdoor image 1204. Correlated indoor-outdoor image 1206 includes the context of exterior features that can impact floor plan 1202, such as vegetation and a roadway. Also, correlated indoor-outdoor image 1206 includes orientation 1208.

Figure 13:
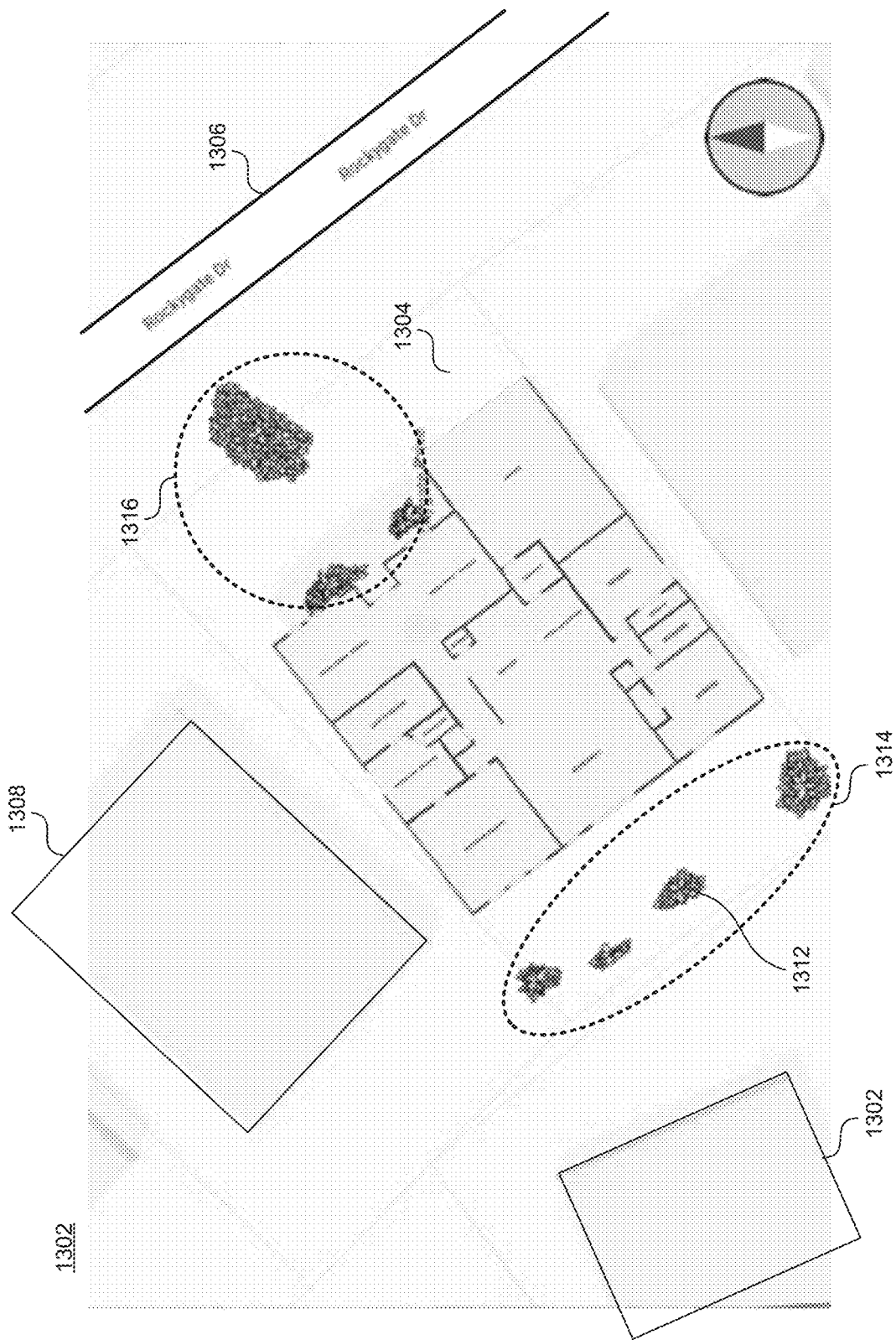
FIG. 13 is block diagram illustrating a process performed by a valuation system for identifying exterior features associated with a property.

FIG. 13 is a block diagram illustrating a process performed by a valuation system for identifying exterior features associated with a property. FIG. 13 illustrates vegetation identified by valuation computer system 100 (shown in FIG. 1) using computer vision techniques. In response to correlated indoor-outdoor image 1206 (shown in FIG. 12), valuation computer system 100 can utilize computer vision module 106 (shown in FIG. 1) to identify exterior features, such as vegetation and adjacent shadow-producing buildings.

In the example implementation, valuation computer system 100 identifies vegetation area 1316. Valuation computer system 100 can determine that vegetation area 1316 obscures the view from a portion of floor plan 1304. Valuation computer system 100 can also identify vegetation 1314 and 1312 based on outdoor image data, using computer vision module 106.

Valuation computer system 100 can identify roadway 1306, and can further determine a proximity between roadway 1306 and floor plan 1304. In some implementations, valuation computer system 100 can determine the distance between roadway 1306 and rooms within floor plan 1304, such as bedrooms.

Valuation computer system 100 identifies adjacent shadow-producing buildings 1308 and 1302. Valuation computer system 100 can further calculate the shadow impact of the adjacent buildings on floor plan 1304, as described in FIG. 14. Adjacent buildings 1308 and 1302 can produce shadows similar to vegetation 1316.

FIG. 14 is a block diagram illustrating a process performed by a valuation system for generating shadow projections based on identified exterior features. Valuation computer system 100 is configured to generate shadow cast simulations. In the illustrated implementation, valuation computer system 100 generates two different shadow cast simulations for two different times (e.g., morning, afternoon, mid-day, autumn, winter, summer, spring). The shadow cast simulations visualize the impact of shadow-projecting exterior features (e.g., vegetation, adjacent buildings) on properties/floor plans (e.g., one or more rooms).

Environment 1424 (e.g., annotated and correlated indoor-outdoor image data) includes tree 1404, adjacent building 1412, and adjacent building 1416. Valuation computer system 100 generates two shadow cast simulations for environment 1424, simulation 1420 and simulation 1422.

Simulation 1420 is for a morning time and reflects a first position of the sun. Valuation computer system 100 calculates a shadow for each of tree 1404, building 1412, and building 1416 based on the first position of the sun, and generates simulation 1420. Simulation 1420 indicates tree 1404 casts a shadow onto dining room 1406 of floor plan 1402. Simulation 1420 further indicates building 1412 and 1416 do not cast shadows onto floor plan 1402 at the morning time.

Simulation 1422 is for an afternoon time and reflects a second position of the sun. Valuation computer system 100 calculates, again, a shadow for each of tree 1404, building 1412, and building 1416 based on the second/updated position of the sun. Simulation 1422 indicates tree 1404 no longer casts a shadow onto floor plan 1402. However, building 1412 has a shadow impacting living room 1410 of floor plan 1402. Building 1416 has a shadow impacting garden 1408 of floor plan 1402.

In some implementations, valuation computer system 100 is configured to generate interior graphical simulations based on the shadow cast simulations. Overall, valuation computer system 100 can generate a simulated interior property image reflecting a specific light condition. For context, interior photos of properties are often brightly lit, to enable users to inspect details of the photos. However, this artificial photography lighting can prevent users from analyzing the natural lighting conditions of the property.

Valuation computer system 100 is configured to select an interior photo of the property and a corresponding room from floor plan 1402, using correlated indoor-outdoor image data. Valuation computer system 100 further selects a shadow cast simulation (e.g., simulation 1422, simulation 1420). Valuation computer system 100 is configured to determine the shadow projections (if any) impacting the selected room from floor plan 1402 (e.g., living room 1410, dining room 1406). Valuation computer system 100 subsequently transforms the interior property image of the selected room based on the identified shadows. In some implementations, valuation computer system 100 can adjust the brightness of the interior property image based on the number of identified shadows from the shadow projections. In other implementations, valuation computer system 100 can define multiple areas of the interior photo based on identified interior features (e.g., windows) and selectively adjust the brightness of the photo. In yet other implementations, valuation computer system 100 can superimpose simulated shadows onto the interior property image based on the identified shadows. In still other implementations, valuation computer system 100 can implement machine learning and/or computer vision techniques to generate an interior graphical simulation. For example, valuation computer system 100 can include a neural network trained on naturally lit interior photos tagged with shadow projection data. Thus, valuation computer system 100 can generate interior graphical simulations approximating natural light-based shadow cast simulations.

Shadows, sunlight, and shade can impact the value of a home. For example, shade and/or a lack of direct sunlight can decrease the value of a property in areas that receive less natural light, such as Seattle. As another example, shade can increase the value of a property in an area with intense natural light, such as Arizona. The impact of these conditions can be difficult for consumers to visualize. Valuation computer system 100 can be configured to generate shadow projections, and to generate property valuations based on the simulated impact of the shadow projections. Machine learning module 110 can generate property valuations based on the brightness of a home and its rooms when impacted by the number of and coverage of the shadow projections. Many overlapping shadow projections that cover most of a room can cause the room to be much darker. A much darker room can cause the property valuation to be higher or lower depending on whether the lack of sunlight is desirable (e.g., dependent on the geographic location). Machine learning module 110 can analyze shadow projections in view of additional property data, such as geographic location. For example, because lack of sunlight can decrease the value of property in areas that receive less natural light, a large quantity of shadow projections would have a negative impact on a property's value. In contrast, because lack of sunlight can increase the value of a property in areas with intense natural light, a lot of shadow projections would have a positive impact on a property's value.

Valuation computer system 100 can further analyze the impact of shadow/sunlight conditions on individual rooms to determine the valuation for the property. For example, machine learning module 110 can determine that a nursery (e.g., a small, secondary bedroom) can receive direct sunlight when no shadow projections impact the nursery for most of the day, and thus determine a reduced property valuation. As another example, machine learning module 110 can determine that a kitchen receives direct sunlight when no shadow projections impact the kitchen in a floor plan, and thus determine an increased property valuation. As yet another example, machine learning module 110 can determine a backyard (e.g., garden) receives partial shade when a few shadow projections impact but do not fully cover the backyard, and further determine an increased property valuation.

Valuation computer system 100 can further analyze the type of shadow/shade when calculating a property valuation. For example, artificial shade conditions determined from shadow projections that come from buildings, constructions, infrastructures, or other artificial shade sources can have a substantial negative impact on property valuations. In contrast, natural shade conditions (e.g., trees, foliage) determined from shadow projections that come from trees, foliage, or other natural shade sources can have a more moderate impact on property valuations. In other words, a window blocked by a building can have a lower value than a window blocked by a tree. In some implementations, machine learning module 110 can determine the type (e.g., natural, artificial) of shade/shadow, and further calculate a property valuation based at least in part on this determination.

Figure 15:
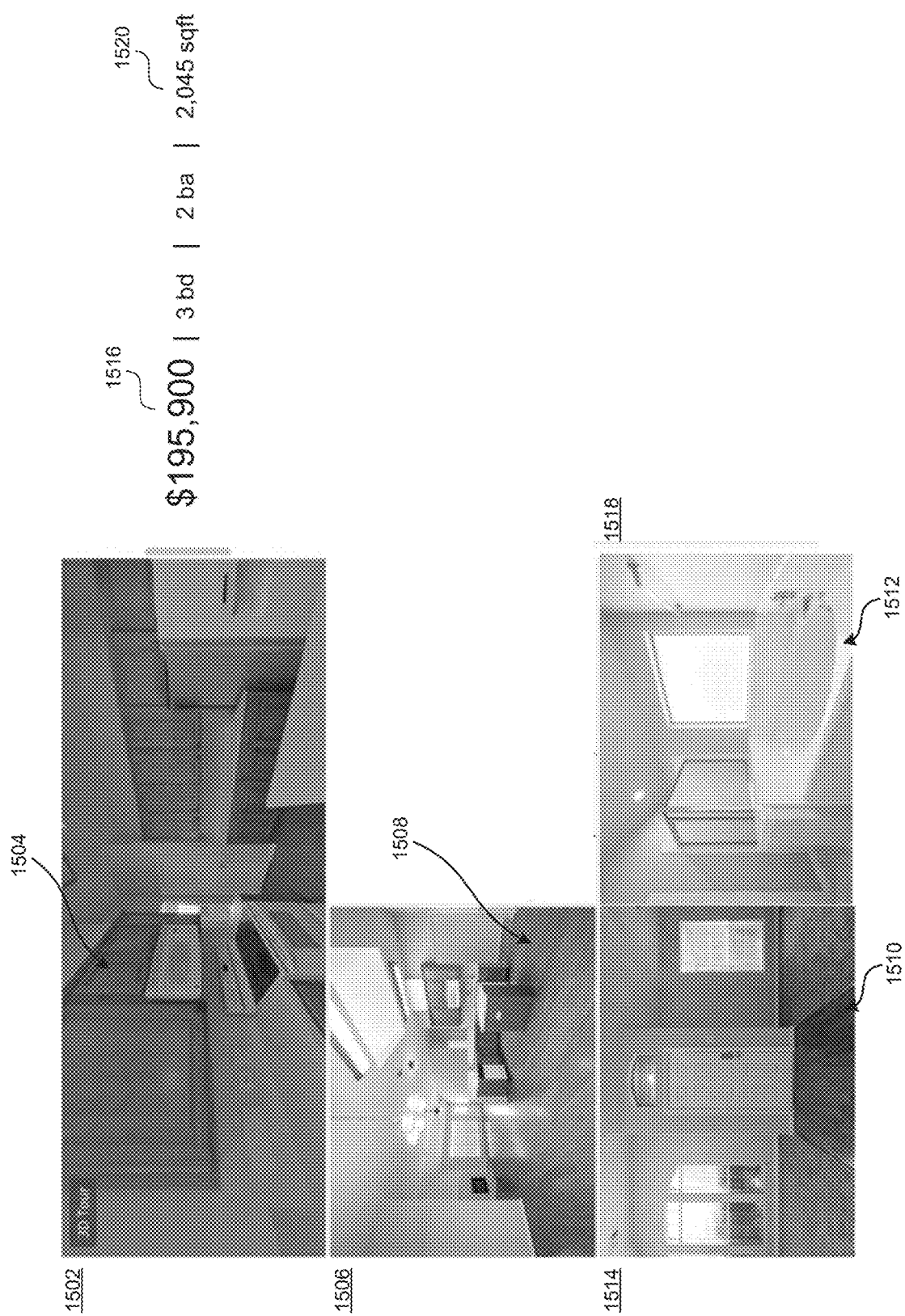
FIG. 15 is block diagram illustrating a process performed by a valuation system for identifying interior features based on interior property images.

FIG. 15 is a block diagram illustrating a process performed by a valuation system for identifying interior features based on interior property images. FIG. 15 illustrates the identification of interior features in property image data. Valuation computer system 100, including computer vision module 106, is configured to identify interior features in property image data. FIG. 15 illustrates multiple interior photos of a property (e.g., property image data).

Image 1502 includes cabinet feature 1504. Cabinet feature 1504 can be detected by valuation computer system 100 using machine learning and/or computer vision techniques. For example, valuation computer system 100 can include a neural network trained on image data tagged with cabinet features. Thus, valuation computer system 100 can implement the neural network to identify cabinet features in new/untrained images, such as image 1502.

Image 1506 includes flooring feature 1508. Valuation computer system 100 can identify flooring feature 1508 using computer vision techniques. More specifically, computer vision module 106 can determine flooring feature 1508 has the attribute of "hardwood flooring" based on identifying the pattern of the flooring.

Image 1514 includes flooring feature 1510. Notably, image 1514 includes two types of flooring (e.g., carpet, hardwood) and valuation computer system 100 is configured to identify the distinct areas of flooring, such as flooring feature 1510. Valuation computer system 100 can determine the boundary/area of flooring feature 1510 based on analyzing the pattern (e.g., pixel data from the image). Valuation computer system 100 can further determine flooring feature 1510 has the attributes "entryway" and "tile."

Image 1518 includes bathroom fixture feature 1512. Valuation computer system 100 can identify bathroom fixture feature 1512 using computer vision and/or machine learning techniques. Valuation computer system 100 can further determine bathroom fixture 1512 is of the type "spa tub". In one implementation, computer vision module 106 includes a neural network trained on images of bathroom fixtures (e.g., catalog photos). In another implementation, computer vision module 106 includes a neural network trained on images of bathrooms including manually tagged fixtures (e.g., open source photos, commercial training data).

Machine learning module 110 is configured to generate valuation 1516 based at least in part on the identified features. Machine learning module 110 can determine that image 1502 indicates a large amount of cabinets (e.g., cabinet feature 1054). Image 1506, including flooring feature 1508, indicates a large open hardwood flooring area. Image 1518 includes bathroom fixture feature 1512, which has the type of "spa tub". Valuation computer system 100, including machine learning module 110, can generate valuation increase valuation 1516 based on these premium features. For example, valuation computer system 100 can generate valuation 1516 based on a neighborhood price range and selecting a valuation within the neighborhood price range based on the identified features.

In some implementations, valuation computer system 100 is configured to determine property interior area 1520 based at least in part on flooring features 1506 and 1510. More specifically, valuation computer system 100 can aggregate the flooring features to determine an estimated square footage (e.g., property interior area).

Figure 16:
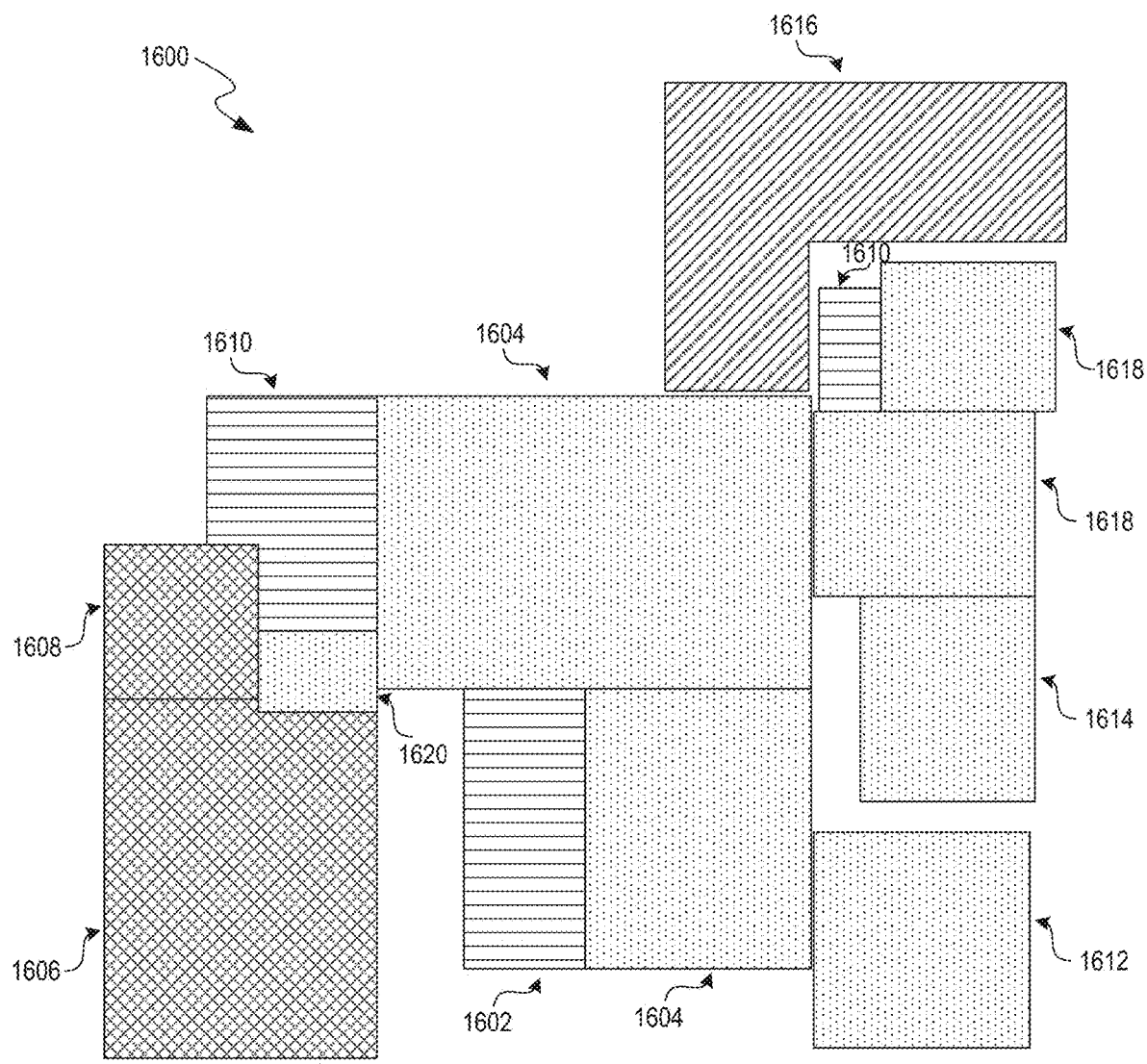
FIG. 16 is a block diagram illustrating a flooring overview image generated by a valuation system.

FIG. 16 is a block diagram illustrating a flooring overview image generated by valuation computer system 100. In some implementations, valuation computer system 100 generates a flooring overview image, such as flooring overview image 1600. Valuation computer system 100 can then use the generated flooring image (and/or associated data) to generate/revise property valuations. Flooring overview image 1600 is based on a virtual floor plan generated by valuation computer system 100, as described at FIG. 10. In other words, flooring overview image 1600 can be virtual floor plan based on interior image data, with additional textures of the flooring material added. For example, rooms with hardwood flooring or carpeting can have that material superimposed on the room's representation in the virtual floor plan, to create flooring overview image 1600. In some implementations, a stock texture/image is used to represent flooring types such as concrete, tile, wood, carpeting, artificial wood, natural stone, engineered stone, and so on. In other implementations, the texture applied to the rooms in flooring overview image 1600 is based on interior images of the rooms. For example, a sample of the carpet for room can be used as the texture for the room's representation in the virtual floor plan.

Flooring overview image 1600 includes entryway 1602 which has a tile material indicated on the image. Living areas 1604 have wood flooring, as indicated by the wood pattern. Hallway 1620 also has wood flooring. Bedroom 1606 has carpeting, while bedroom 1612 has wood flooring. Thus, flooring overview image 1600 enables more efficient analysis of the associated property, by combining analysis of both the floor plan and the flooring materials. For example, the difference in flooring material between bedroom 1606 and 1612 can impact the valuation of the property. For example, stain resistant flooring materials (e.g., wood) in secondary bedrooms can be desirable to reduce wear/staining associated with children. However, it can be less desirable in master bedrooms. As another example, the durable materials (e.g. tile, wood) used in hallway 1620 and entryway 1602 can also impact the valuation of the property. For example, investment property owners can desire durable flooring materials to reduce carpet cleaning/replacement costs. Thus, a property with durable flooring materials can have a higher value in neighborhoods associated with rental properties and starter homes. As another example, properties with luxury carpeting can have elevated values in premium neighborhoods.

Closet 1608 has carpeting. Bathroom 1610 has tile flooring. Kitchen 1614 has wooden flooring, in addition to multipurpose room 1618. In some implementations, flooring overview image 1600 can include outdoor spaces. For example, exterior concrete area 1616 is shown. Flooring overview images can include outdoor materials such as concrete, gravel, asphalt, paving, and so on.

Figure 17:
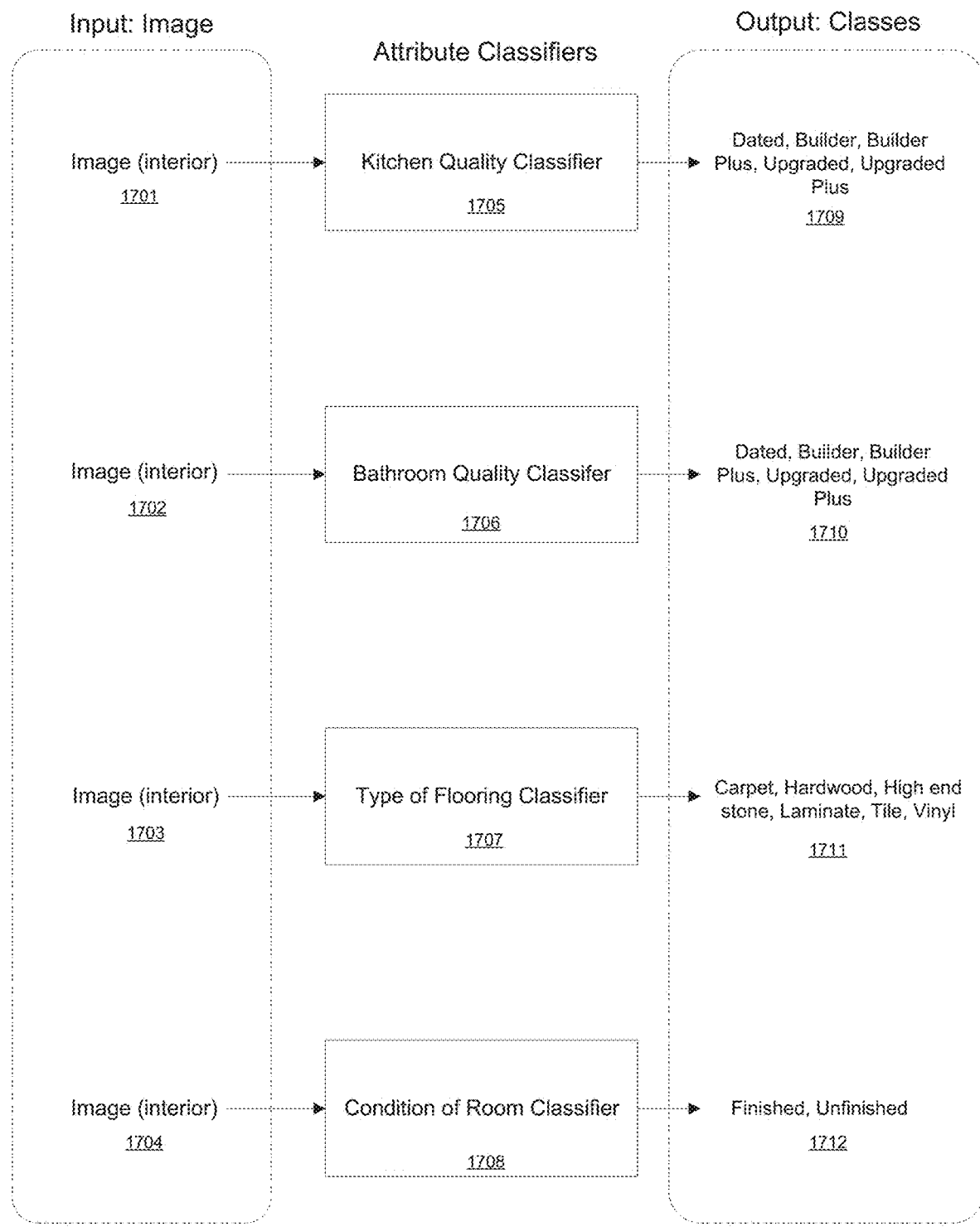
FIG. 17 is a block diagram illustrating components of a valuation system for identifying interior attributes of interior features based on interior property images.

FIG. 17 is a block diagram illustrating components of a valuation system for identifying interior attributes of interior features based on interior property images. Computer vision module 106 can identify any number of interior features in each of the interior property images 1701, 1702, 1703, and 1704 such as kitchen appliances in image 1701, sinks or toilets in image 1702, a floor in image 1703, or a room in image 1704. Computer vision module 106 can also subsequently classify images 1701 and 1702 into room types by examining the interior features and determining what room type contains those interior features, such as classifying image 1701 as a kitchen and image 1702 as a bathroom. Computer vision module 106 can then identify interior attributes of the identified interior features and room types using attribute classifiers. Interior attributes of the interior features can include quality, type/material, condition, and so on.

Computer vision module 106 can include, but is not limited to, the different attribute classifiers 1705, 1706, 1707, and 1708 to identify interior attributes of images with different interior features or of different room types. A kitchen quality classifier 1705 can classify the interior features (e.g., quality of a kitchen appliance) of input image 1701 that is of a kitchen room type as kitchen attribute quality class 1709: dated, builder, builder plus, upgraded, or upgraded plus. A master bathroom quality classifier 1706 can classify the interior features (e.g. quality of sink or toilet) of input image 1702 that is of a master bathroom type as bathroom quality attribute class 1710: dated, builder, builder plus, upgraded, or upgraded plus. A type of flooring classifier 1707 can classify the interior features of input image 1703 that has a floor as type of flooring attribute class 1711: carpet, hardwood, high end stone, laminate, tile or vinyl. A condition of room classifier 1708 can classify the interior features of input image 1704 that is any room type as condition of room attribute class 1712: finished or unfinished. To identify interior attributes, each of the attribute classifiers 1705, 1706, 1707, and 1708 can include a machine learning model (e.g., neural network) trained on images containing annotated interior features pre-tagged with associated interior attributes. The tag for each interior feature identifies what the specific interior attribute class is associated. For example, the machine learning model for a kitchen quality classifier can be trained on interior photos/panoramic photos that have annotated kitchen features each pre-tagged as: dated, builder, builder plus, upgraded, or upgraded plus. The list of interior attribute class tags is not limited to ones described but can include any that is learned from a set of images tagged with interior attributes.

Examples of the outputted kitchen quality attribute class 1709 of the kitchen quality classifier 1705 can be dated, builder, builder plus, upgraded, or upgraded plus. A kitchen quality attribute class of dated can describe kitchen features having dated finishes and are unlikely to have been updated in over 30 years. For example, a kitchen can have features with dated attributes such as old laminate counters, mismatched finishes, or out-of-style cabinets. A kitchen quality attribute class of builder can describe kitchen features with basic builder-grade finishes, mostly uniform and relatively recent styling/materials, but not high-end. For example, a kitchen can have features with builder attributes such as Corian, tile, or laminate finishes or styling/materials. A kitchen quality attribute class of builder plus can describe standard kitchen features with some upgrades, but not fully upgraded. For example, a kitchen's features with builder plus attributes may have only one of upgraded counters (e.g., made of quartz, marble, granite, newer butcher block, etc.) or upgraded cabinets (e.g., increased height, high quality wood, modern design/color, etc.). A kitchen quality attribute class of upgraded can describe kitchen features as being fully remodeled or semi-recently built, with high-end finishes and no further upgrades needed. For example, a kitchen's features with upgraded attributes may have both upgraded counters and upgraded cabinets. A kitchen quality attribute class of upgraded plus can describe kitchen features having full high-end remodel/newer builds that look custom and are cuts above typical upgraded kitchen features. For example, a kitchen's features with upgraded plus attributes may have all 5 of: upgraded counters, backsplash, cabinets, appliances, and fixtures.

The outputted bathroom quality attribute class 1710 of the master bathroom quality classifier 1706 can be dated, builder, builder plus, upgraded, or upgraded plus. A bathroom quality attribute class of dated can describe bathroom features having outdated, basic, and potentially original finishes, while unlikely to have been updated in over 30 years. For example, a bathroom can have features with dated attributes such as a tub/shower with an original finish and not updated for 40 years. A bathroom quality attribute class of builder can describe bathroom features with basic builder finishes and relatively recent styling/materials. For example, a bathroom can have features with builder attributes such as a fiberglass or plastic tub/shower, and laminated counters. A bathroom quality attribute class of builder plus can describe bathroom features as being partially upgraded. For example, a bathroom's features with builder plus attributes may have one of an upgraded shower/tub or upgraded vanity. A bathroom quality attribute class of upgraded can describe bathroom features as being fully upgraded. For example, a bathroom's features with upgraded attributes may have both an upgraded tub/shower and upgraded vanity. A bathroom quality attribute class of upgraded plus can describe bathroom features as being fully upgraded with additions. For example, a bathroom's features with upgraded plus attributes may have all upgraded class attributes and also additional upgrades not included in the upgraded class (e.g., a second bath with upgraded attributes).

In some implementations, each of the attribute classifiers 1705, 1706, 1707, and 1708 can examine multiple interior property images corresponding to different rooms to generate attribute classes. To generate attribute classes, each of the attribute classifiers can include a machine learning model (e.g., neural network) trained on images for different rooms containing annotated interior features pre-tagged with associated interior attributes. By examining multiple interior property images, the attribute classifier can determine differences and similarities in interior attributes for interior features of different rooms. For example, an attribute classifier can input images for both a kitchen and a foyer to classify the kitchen features as kitchen quality upgraded and the foyer features as foyer quality builder. The attribute classifier can also examine the multiple interior property images to generate an attribute class for the entire home that the multiple interior property images capture. For example, an attribute classifier can input two or more interior property images of a home to classify the entire home as home quality builder plus.

In some implementations, the attribute classifiers 1705, 1706, 1707, and 1708 each implement a neural network (e.g., convolutional neural network) to classify their respective input interior property images 1701, 1702, 1703, and 1704. The neural network model architecture can be a cascaded or an ensemble, and the model architecture can include a backbone to extract features and attributes of the input, with added modification layers (e.g., convolutional layers, pooling layers, densely-connected layers, fully-connected layers, etc.). The input image to an attribute classifier can include interior property image data such as a panoramic photo, photo, or video. In some implementations, the computer vision module 106 can first classify the input image into a room type before it is input into an attribute classifier. With knowledge of what the room type is, the attribute classifier can better determine the interior attributes of the interior features relevant to the identified room type. The output of the attribute classifier can be predicted attribute classes 1709, 1710, 1711, or 1712 for the interior features of the input image depending on what the attribute classifier is classifying (e.g., kitchen quality, bathroom quality, type of flooring, or condition of room).

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number can also include the plural or singular number respectively. The word "or," in reference to a list of two or more items, covers all of the following interpretations of the word: any of the items in the list, all of the items in the list, and any combination of the items in the list.

The above-detailed description of implementations of the system is not intended to be exhaustive or to limit the system to the precise form disclosed above. While specific implementations of, and examples for, the system are described above for illustrative purposes, various equivalent modifications are possible within the scope of the system, as those skilled in the relevant art will recognize. For example, some network elements are described herein as performing certain functions. Those functions could be performed by other elements in the same or differing networks, which could reduce the number of network elements. Alternatively, or additionally, network elements performing those functions could be replaced by two or more elements to perform portions of those functions. In addition, while processes, message/data flows, or blocks are presented in a given order, alternative implementations can perform routines having blocks, or employ systems having blocks, in a different order, and some processes or blocks can be deleted, moved, added, subdivided, combined, and/or modified to provide alternative or subcombinations. Each of these processes, message/data flows, or blocks can be implemented in a variety of different ways. Also, while processes or blocks are at times shown as being performed in series, these processes or blocks can instead be performed in parallel, or can be performed at different times. Further, any specific numbers noted herein are only examples: alternative implementations can employ differing values or ranges.

The teachings of the methods and system provided herein can be applied to other systems, not necessarily the system described above. The elements, blocks and acts of the various implementations described above can be combined to provide further implementations.

Any patents and applications and other references noted above, including any that can be listed in accompanying filing papers, are incorporated herein by reference. Implementations of the technology can be modified, if necessary, to employ the systems, functions, and concepts of the various references described above to provide yet further implementations of the technology.

These and other changes can be made to the invention in light of the above Detailed Description. While the above description describes certain implementations of the technology, and describes the best mode contemplated, no matter how detailed the above appears in text, the invention can be practiced in many ways. Details of the system can vary considerably in its implementation details, while still being encompassed by the technology disclosed herein. As noted above, particular terminology used when describing certain features or implementations of the technology should not be taken to imply that the terminology is being redefined herein to be restricted to any specific characteristics, features, or implementations of the technology with which that terminology is associated. In general, the terms used in the following claims should not be construed to limit the invention to the specific implementations disclosed in the specification, unless the above Detailed Description section explicitly defines such terms. Accordingly, the actual scope of the invention encompasses not only the disclosed implementations, but also all equivalent ways of practicing or implementing the invention under the claims.

While certain implementations of the technology are presented below in certain claim forms, the inventors contemplate the various implementations of the technology in any number of claim forms. For example, while only one implementation of the invention is recited as implemented in a computer-readable medium, other implementations can likewise be implemented in a computer-readable medium. Accordingly, the inventors reserve the right to add additional claims after filing the application to pursue such additional claim forms for other implementations of the technology.

We claim:

1. A computer-implemented method for generating property valuations using correlated indoor and outdoor images, the method comprising:
   accessing a set of interior image data records and a set of outdoor image data records for a property;

generating correlated indoor-outdoor image data by correlating one or more of the set of interior image data records and one or more of the set of outdoor image data records;
using the correlated indoor-outdoor image data, identifying: (1) one or more interior features, and (2) one or more of exterior features;
generating a valuation for the property using the identified one or more interior features and the identified one or more exterior features;
using the set of interior image data records, identifying a set of interior attributes;
using the set of outdoor image data records, identifying a set of exterior attributes; and
adjusting the valuation for the property based on the identified set of interior attributes, the identified set of exterior attributes, or both.

2. The method of claim 1, wherein the set of outdoor image data records comprise data from aerial images, satellite images, drone images, drone footage, 360-degree panoramic images, regular camera images, LIDAR, thermal images, third-party sources, or any combination thereof.

3. The method of claim 1, wherein the set of interior image data records comprises data from panoramic photos, photos, videos, or any combination thereof.

4. The method of claim 1, further comprising:
generating a set of shadow projections;
simulating an impact of the set of shadow projections on a subset of interior image data records in the set of interior image data records; and
adjusting the valuation for the property based on the impact of the set of shadow projections.

5. The method of claim 1, further comprising:
adjusting a brightness of a subset of interior image data records in the set of interior image data records; and
adjusting the valuation for the property based on the brightness of the subset of interior image data records.

6. The method of claim 1, further comprising:
segmenting records in the set of outdoor image data records into one or more distinct areas to generate segmented outdoor image data; and
further generating correlated indoor-outdoor image data by correlating a subset of interior image data records in the set of interior image data records to the segmented outdoor image data by fitting the subset of interior image data records to the one or more distinct areas identified in the segmented outdoor image data.

7. The method of claim 1, further comprising:
identifying a window feature and one or more exterior features correlated with the window feature from the correlated indoor-outdoor image data;
determining whether the one or more exterior features correlated with the window feature block a view of the window feature; and
adjusting the valuation for the property based on whether the one or more exterior features correlated with the window feature block the view of the window feature.

8. At least one non-transitory, computer-readable medium carrying instructions, which when executed by at least one data processor, performs operations for generating property valuations using indoor images, the operations comprising:
accessing a set of interior image data records for a property;
segmenting records in the set of interior image data records into one or more identified rooms;
identifying a plurality of interior features in the set of interior image data records;
assigning a room type to the one or more identified rooms using the identified plurality of interior features; and
generating a valuation for the property using the assigned room type of the one or more identified rooms.

9. The computer-readable medium of claim 8, wherein the room type of the one or more identified rooms comprises at least one of: bedroom, kitchen, bathroom, living room, dining room, nursery, multipurpose room, or room types identified by home appraisers as being important for home evaluation.

10. The computer-readable medium of claim 8, wherein the operations further comprising:
accessing a set of exterior image data records for a property;
using the set of interior image data records, identifying a set of interior attributes;
using the set of exterior image data records, identifying a set of exterior attributes; and
adjusting the valuation for the property based on the identified set of interior attributes, the identified set of exterior attributes, the identified room type of the one or more identified rooms, or any combination thereof.

11. The computer-readable medium of claim 10, wherein the operations further comprising storing the valuation, the one or more identified interior features, the one or more identified interior attributes, the one or more exterior attributes, and the room type of the one or more identified rooms in a valuation database.

12. The computer-readable medium of claim 8, wherein the operations further comprising retrieving supplemental property data for the property, wherein the supplemental property data comprises at least one of: ambient noise recordings, privacy data, flow of home, a list of features identified by home appraisers as being important for home evaluation, or data collected by IoT devices.

13. The computer-readable medium of claim 12, wherein the operations further comprising:
identifying a set of noise features for the property from the retrieved supplemental property data; and
adjusting the valuation for the property based on the identified set of noise features.

14. A computer-implemented method for correlating outdoor images to property floor plans, the method comprising:
accessing a set of interior image data records for a property;
generating a virtual floor plan for the property using a subset of interior image data records selected from the set of interior image data records,
wherein the virtual floor plan for the property is generated by:
segmenting records in the set of interior image data records into one or more identified rooms;
identifying a plurality of floor plan features in records in the subset of interior image data records;
determining a relative location of each of the one or more identified rooms using the plurality of floor plan features;
accessing a set of interior material textures for the property;
determining a set of distinct areas of flooring for each of the one or more identified rooms in the virtual floor plan,
wherein the distinct areas of flooring are based on segmented interior image data records; and associating the set of distinct areas of flooring in the virtual floor plan with one or more of the interior material textures; and generating a valuation for the property using the generated virtual floor plan.

15. The method of claim 14, further comprising:
modifying or scaling the generated virtual floor plan before superimposing the generated virtual floor plan onto a set of outdoor image data for the property.

16. The method of claim 14, further comprising:
generating one or more flooring statistics for the generated virtual floor plan, wherein the flooring statistics are based, in part, on percentage of the distinct areas of flooring in the virtual floor plan associated with a specific interior material texture.

17. The method of claim 14, wherein one or more of the interior material textures are generated based on image data records in the set of interior image data records.

18. The method of claim 14, wherein one or more of the interior material textures are generated based on stock texture image data.

19. The method of claim 14, further comprising:
accessing a set of outdoor image data records for a property;

generating correlated indoor-outdoor image data by correlating the generated virtual floor plan to the set of outdoor image data records by fitting the generated virtual floor plan to a property area identified in the set of outdoor image records;

using the correlated indoor-outdoor image data, identifying: (1) one or more interior features, and (2) one or more of exterior features; and adjusting the valuation for the property using the identified one or more interior features, the one or more exterior features, or any combination thereof.

20. The method of claim 19, further comprising:
storing the valuation, the one or more identified interior features, the one or more exterior features, the correlated indoor-outdoor image data, or the one or more interior material textures in a valuation database.

* * * * *